(12) United States Patent
Komobuchi et al.

(10) Patent No.: US 6,890,834 B2
(45) Date of Patent: May 10, 2005

(54) ELECTRONIC DEVICE AND METHOD FOR MANUFACTURING THE SAME

(75) Inventors: Hiroyoshi Komobuchi, Kyoto (JP); Minoru Kubo, Nabari (JP); Masahiko Hashimoto, Shijonawate (JP); Michio Okajima, Neyagawa (JP); Shinichi Yamamoto, Hirakata (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 211 days.

(21) Appl. No.: 10/163,691

(22) Filed: Jun. 6, 2002

(65) Prior Publication Data

US 2003/0183921 A1 Oct. 2, 2003

(30) Foreign Application Priority Data

Jun. 11, 2001 (JP) ........................................ 2001-176184

(51) Int. Cl.[7] .............................................. H01L 21/30
(52) U.S. Cl. ........................... 438/455; 438/26; 438/55; 438/125; 438/126; 438/456; 438/457; 438/458; 438/459
(58) Field of Search ................................ 438/455–459, 438/26, 55, 125, 126

(56) References Cited

U.S. PATENT DOCUMENTS 6,297,072 B1 * 10/2001 Tilmans et al. ............. 438/106
6,391,742 B2 * 5/2002 Kawai ......................... 438/456
6,458,618 B1 * 10/2002 Allen et al. .................. 438/53
2002/0081821 A1 * 6/2002 Cabuz et al. ................ 438/455
2002/0088537 A1 * 7/2002 Silverbrook ................ 156/247
2002/0096743 A1 * 7/2002 Spooner et al. ............. 257/620

FOREIGN PATENT DOCUMENTS

| JP | 11111878 A | 4/1999 |
| JP | 2000-133817 A | 5/2000 |
| WO | WO 95/17014 | 6/1995 |

OTHER PUBLICATIONS

Notice of Reasons of Rejection for Patent Application No. 2002–161816 mailed Oct. 21, 2003 and English translation.

* cited by examiner

*Primary Examiner*—Alexander Ghyka
(74) *Attorney, Agent, or Firm*—Harness, Dickey & Pierce, P.L.C.

(57) ABSTRACT

An Al film is formed on a cap wafer and the Al film is patterned into a ring-shaped film. Dry etching is performed by using the ring-shaped film as a mask to form a drum portion enclosing a recess portion to provide a vacuum dome. After forming a depth of cut into the substrate portion of the cap wafer, the cap wafer is placed on a main body wafer having an infrared area sensor formed thereon. Then, the ring-shaped film of the cap wafer and the ring-shaped film of the main body wafer are joined to each other by pressure bonding to form a ring-shaped joining portion.

20 Claims, 13 Drawing Sheets

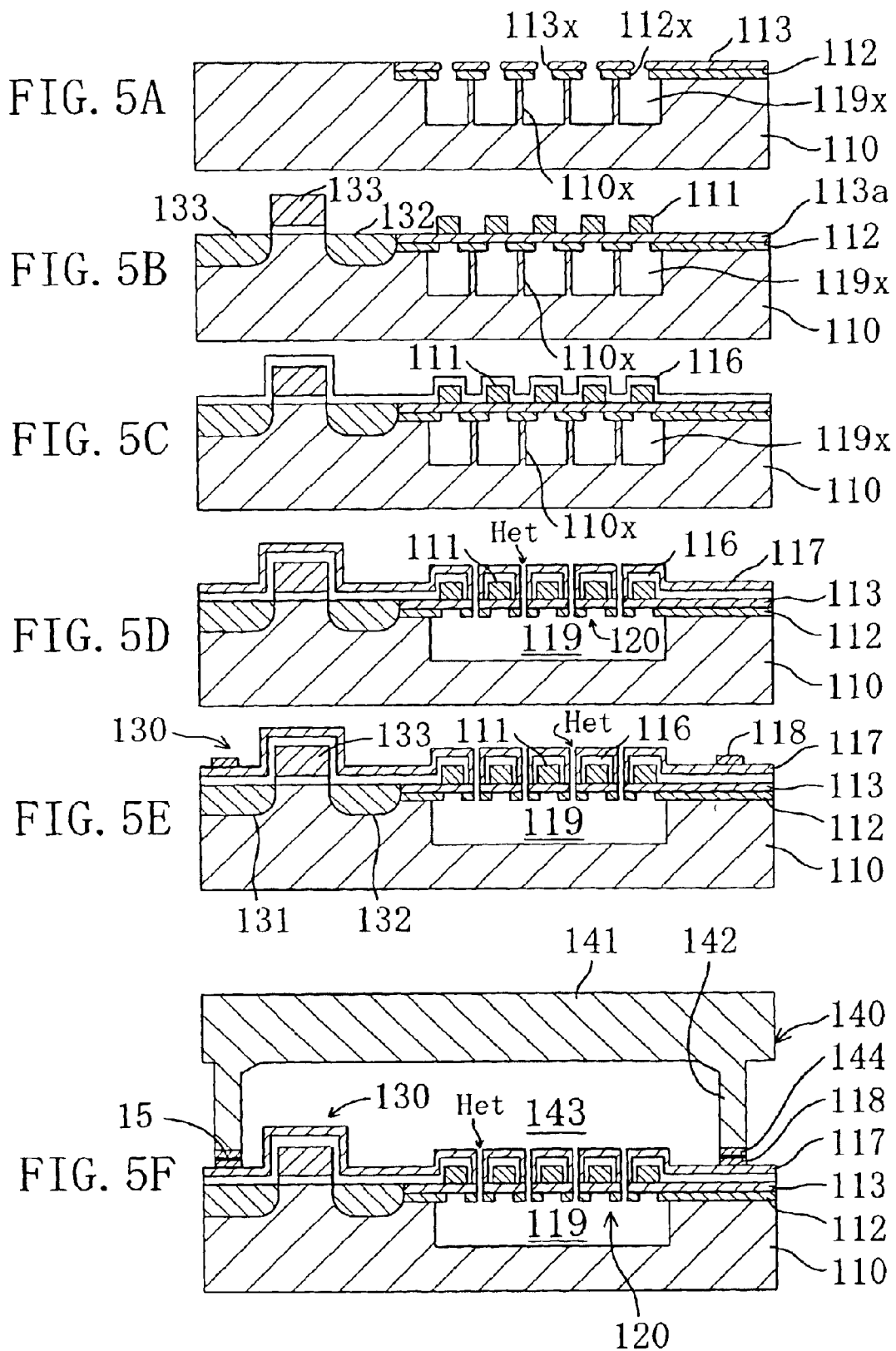

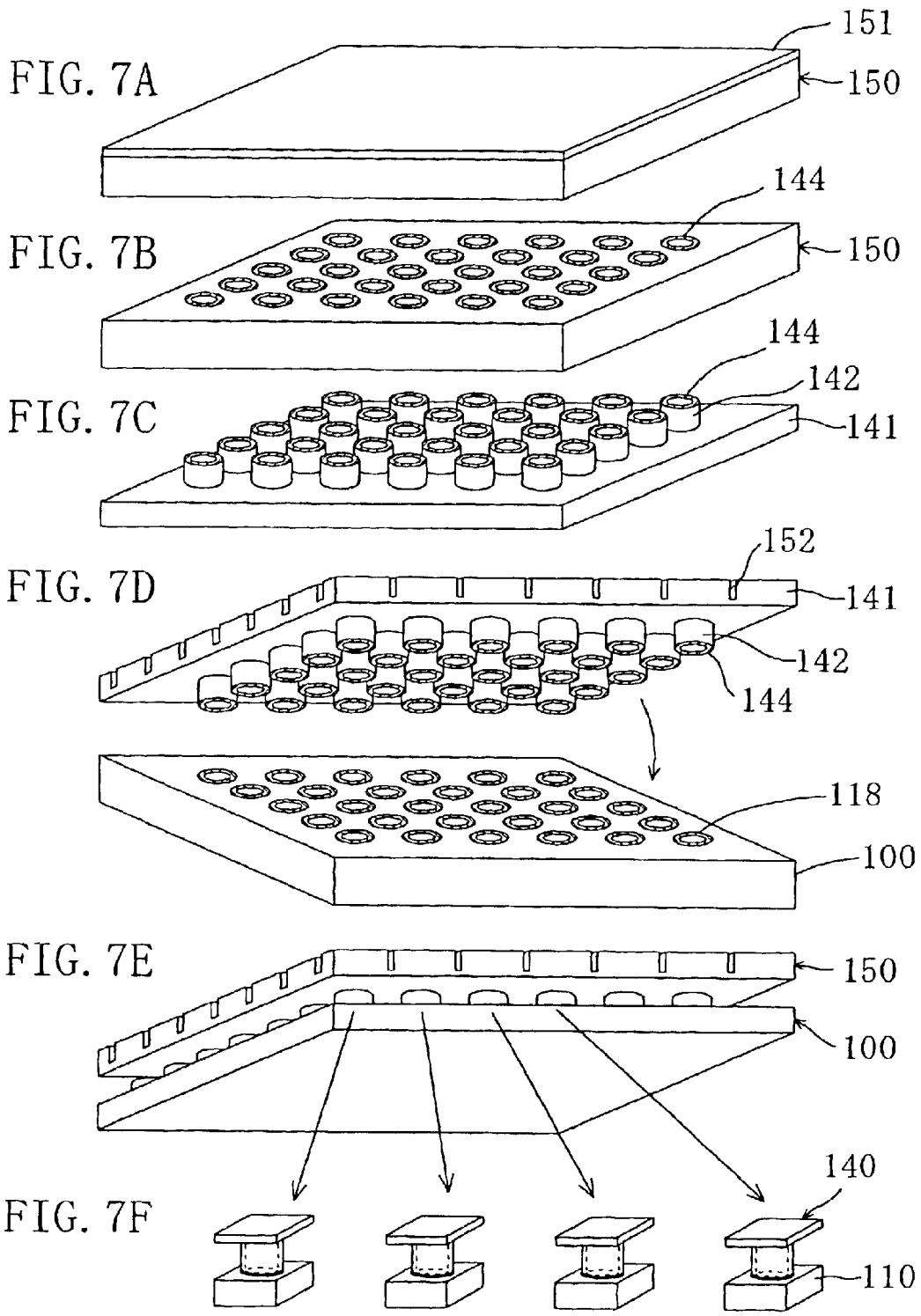

ELECTRONIC DEVICE AND METHOD FOR MANUFACTURING THE SAME

BACKGROUND OF THE INVENTION

The present invention relates to electronic devices, such as sensors and transistors, configured to be sealed in an atmosphere of reduced pressure or an atmosphere of inert gas.

Conventionally, electronic devices exhibiting high performance in an atmosphere of vacuum (or atmosphere of reduced pressure), such as infrared sensors and vacuum transistors, are typically sealed in a case of hermetic seal and ceramic or the like for use thereof. Such vacuum-packaged electronic devices include a so-called discrete type of device having a single sensor disposed therein and an integration type of device having a large number of sensors and transistors arranged in an array-like configuration.

On the other hand, it has been suggested to provide a smaller highly-integrated semiconductor device by sealing sensors, emitting elements or the like arranged in an array-like configuration into an atmosphere of vacuum, but not into a special case of ceramic or the like, by a packaging method employing a process for manufacturing semiconductor devices. For example, the official gazette of international publication No. WO 95/17014 describes a method for sealing a cell array-arranged area into a vacuum atmosphere. Therein, after a cell array of detectors for infrared radiation or the like or a cell array of emitting elements is formed on a first wafer, a second wafer is then placed on the first wafer with a predetermined spacing left between them, and the wafers are joined to each other by solder at the periphery of the cell array while the space between both the wafers is maintained under atmosphere of vacuum.

However, the technique described in the above official gazette has following problems.

First, when a large number of elements such as infrared detectors are arranged in an array-like configuration, it is difficult to make the whole joining portion at the periphery of the cell array completely flat, and thus an excessively high push pressure is inevitably required for thermal pressure bonding, thereby causing the possibility of broken wafers during joining, deteriorated vacuum caused by residual stress and device malfunctions.

Second, if a joining failure is caused at part of the joining portion for maintaining elements such as a large number of infrared detectors under vacuum, the vacuum is broken over the whole cell array, and thus the whole device becomes bad, thus resulting in a high percent defective.

Third, when solder is used for the joining, the degree of vacuum in the inside space having the cell array placed therein can not be higher than a certain level because of outgassing of organic materials included in the solder paste. Therefore, there has been the possibility that an increase in the sensitivity of infrared sensors can be not hoped, for example.

SUMMARY OF THE INVENTION

A first object of the present invention is to provide an electronic device suitable for miniaturization and integration and a method for manufacturing it, by taking measures that seals the electronic device in an atmosphere of pressure-reduced or an atmosphere of inert gas in the unit of the area in which detectors for infrared radiation or the like and electron emitting elements are disposed.

A second object of the present invention is to improve the function of electronic devices such as infrared sensors, by taking measures for providing a higher degree of vacuum in the inside space in which an cell array is placed.

The electronic device according to the present invention comprises a main body substrate having a plurality of cell regions in which at least one element is disposed, a cap body placed on the above described main body substrate, a cavity portion provided in a position having said element disposed therein and being located in at least one cell region of the above described plurality of cell regions, enclosed by the above described main body substrate and the above described cap body, and maintained in an atmosphere of reduced pressure or in an atmosphere of inert gas, and a ring-shaped joining portion provided between the above described main body substrate and the above described cap body for isolating the above described cavity portion from external space.

Thereby, an element such as an infrared sensor and electron emission element or the like can be individually disposed in a cavity portion, which element requires an atmosphere such as an atmosphere of reduced pressure and an atmosphere of inert gas isolated from external space. Thus, it is possible to provide a structure suitable for both a discrete type of electronic device and an integration type of electronic device having a large number of elements integrated therein.

The electronic device further comprises a first ring-shaped film formed on the above described main body substrate and enclosing the above described element, and a second ring-shaped film formed on the above described cap body, wherein the above described ring-shaped joining portion is formed between the above described first and second ring-shaped films. Thereby, it is possible to provide a strong ring-shaped joining portion by selecting the material configuring the first and second ring-shaped films.

The materials of the above described first and second ring-shaped films are preferably selected from at least any one of In, Cu, Al, Au, Ag, Ti, W, Co, Ta, Al—Cu alloy, and an oxide film.

The materials of the above described first and second ring-shaped films are the same material with each other.

The above described main body substrate is configured by semiconductor, and the above described element on the above described main body substrate and an external circuit are electrically connected to each other through an impurity-diffused layer formed in the above described main body substrate to extend across the above described ring-shaped film. Thereby, it is possible to permit an improvement in the reliability of the electrical connection between the above described element and the external circuit.

The above described cap body is provided with a recess portion for forming the above described cavity portion and a drum portion enclosing the recess portion, and the above described main body substrate is provided with a engagement portion for engaging with the above described drum portion. Thereby, it is possible to provide an electronic device having a stable position connection between the main body substrate and the cap body and the high reliability of the joining.

The above described electronic device is preferably an element selected from any one of an infrared sensor, pressure sensor, acceleration sensor and vacuum transistor.

If the above described electronic device is an infrared sensor, the element provided on the above described main body substrate is a thermoelectric transducer element.

In this case, the above described cap body has a Si substrate and a semiconductor layer provided on the Si substrate and having a band gap of less than 1.1 eV. Thereby, it is possible to avoid the superimposition of background signals caused by light near visible light, and therefore a large dynamic range can be ensured for infrared detection, thus providing an electronic device suitable for detecting a human and an animal.

In this case, the top layer of the above described cap body is configured by a Si layer having a diffraction pattern formed thereon to provide a Fresnel lens. Thereby, it is possible to focus infrared radiation on the thermoelectric transducer element in the infrared sensor, thus permitting an improvement in the efficiency of detecting infrared radiation.

The above described electronic device is preferably an infrared sensor having a thermoelectric transducer element, a support member for supporting the above described thermoelectric element, and a second cavity portion formed below the above described support member.

In this case, a pillar or a wall extending from the above described support member is not provided in the above described second cavity portion. Thereby, it is possible to permit an improvement in the sensitivity of detecting infrared radiation and an improvement in the detection accuracy.

Also, the above described second cavity portion is configured to communicate with the described cavity portion. Thereby, it is possible to permit an improvement in the sensitivity of detecting infrared radiation and an improvement in the detection accuracy.

The above described ring-shaped joining portion is provided more than one in number to enclose the above described plurality of cell regions. Thereby, it is possible to provide an integration type of electronic device.

A first method for manufacturing an electronic device according to the present invention comprises a step (a) of preparing a main body substrate having a plurality of cell regions in which at least one element is disposed and a cap substrate, and forming a plurality of recess portions each enclosing at least one cell region of the above described plurality of cell regions on at least any one of the above described main body substrate and the above described cap substrate, and a step (b) of forming a ring-shaped joining portion such that at least part of recess portions of the above described plurality of recess portions may remain as cavity portions isolated from external space between the above described main body substrate and the above described cap substrate, by applying a push pressure between the above described main body substrate and the above described cap substrate.

According to this method, it is possible to manufacture either of a discrete type of electronic device and an integration type of electronic device by using an existing process such as a Si process or the like. In addition to this, since the cavity portions are formed with the cap bodies individually placed on each cell region, even if a junction failure occur in part of the cell regions, the other cell regions are practically usable. Therefore, it is possible to permit an improvement in yield in both a discrete type and an integration type.

In the above described step (a), a plurality of first and second ring-shaped films enclosing the above described recess portions are prepared on the above described main body substrate and cap substrate, respectively, and in the above described step (b), the above described ring-shaped joining portion is formed between the above described first and second ring-shaped films. Thereby, it is possible to form a strong ring-shaped joining portion by selecting the material of the first and second ring-shaped films.

The above described step (b) is performed with the joining using hydrogen bonding and a metallic bond or with room temperature joining, and thus it is possible to reliably isolate the cavity portion from external space.

The above described step (a) is preferably performed by using material selected from at least any one of In, Cu, Al, Au, Ag, Ti, W, Co, Ta, Al—Cu and an oxide film as the materials of said first and second ring-shaped films.

It is preferable that as the materials of the above described first and second ring-shaped films, the same material is used to both films.

The above described step (b) is performed without heating the above described main body substrate and the above described cap substrate to a temperature of not less than 450° C., thereby it is possible to perform the joining without causing damage to Al wiring.

In the above described step (a), a slit for partitioning the above described cap substrate into a plurality of areas is formed in the above described cap substrate, thereby when the first and second films are joined to each other by the application of a push pressure, even if the wafer is warped, it is possible to suppress the occurrence of junction failures caused by local large stress.

In the above described step (a), by forming recess portions enclosed by the above described each second ring-shaped film and a plurality of drum portions enclosing the recess portions on the above described cap substrate, the recess portions need to be formed only in the above described cap substrate. Thereby, it is possible to avoid difficult process steps of manufacturing the main body substrate.

The above described step (a) prepares the above described main body substrate having an engagement portion for engaging with the drum portion of the above described cap substrate. Thereby it is possible to realize an improvement in the accuracy of aligning the first and second ring-shaped films to each other, and thus to provide an electronic device that is highly reliable in the joining.

The above described step (b) is preferably performed in an atmosphere of reduced pressure, or in an atmosphere of inert gas.

The above described step (b) is performed in an atmosphere of reduced pressure having a pressure of higher than $10^{-4}$ Pa. Thereby, it is possible to avoid the difficulty of holding a high vacuum, thus realizing the joining that is practical and suitable for mass production.

By further including a step of breaking the above described main body substrate into each cell after the above described step (b), a discrete type of electronic device can be obtained.

A method for manufacturing a second electronic device comprises a step (a) of preparing a main body substrate having a plurality of cell regions in which at least one element is disposed and a cap substrate, and forming recess portions enclosing the above described plurality of cell regions in at least one of the above described main body substrate and the above described cap substrate, and a step (b) of forming a ring-shaped joining portion with the joining using hydrogen bonding or a metallic bond or with room temperature joining by applying a push pressure between the above described main body substrate and the above described cap substrate, wherein in the above described step (b), the above described ring-shaped joining portion is formed such that at least a portion of the above described recess portions may remain as cavity portions isolated from external space in the above described plurality of cell regions.

By this method, compared to the use of solder joining, it is possible to increase the function of holding the atmosphere in the cavity under a predetermined atmosphere. For example, For an electronic device to which an atmosphere of high vacuum is preferable, it is possible to hold the cavity portion under an atmosphere of high vacuum.

In the above described step (a), a first ring-shaped film enclosing a plurality of cell regions is formed on the above described main body substrate and a second ring-shaped film having approximately the same pattern as said first ring-shaped film is formed on the above described cap substrate, and thereby it is possible to realize strong joining by selecting materials forming first and second ring-shaped portions.

The above described step (a) is preferably performed by using at least any one material selected from the group of In, Cu, Al, Au, Ag, Ti, W, Co, Ta, Al—Cu and an oxide film as the materials of the above described first and second ring-shaped films.

In this case, as the materials of the above described first and second ring-shaped films, the same material is preferably used to both films.

The above described step (b) can be performed without heating the above described main body substrate and the above described cap substrate to a temperature of not less than 450° C.

The above described step (a) can be performed such that all cell regions disposed on one electronic device may be enclosed by the above described first and second ring-shaped films.

BRIEF DESCRIPTION OF THE DRAWINGS

FIGS. 5A to 5F are cross-sectional views for showing process steps for manufacturing an infrared sensor according to the present invention.

FIGS. 7A to 7F are cross-sectional views for showing a cap body used for an infrared sensor according to Embodiment 1.

DETAILED DESCRIPTION OF THE INVENTION (Basic Structure of an Electronic Device)

FIGS. 1A to 1D are cross-sectional views for schematically showing an example of basic structure of an electronic device according to the invention. The concrete structure of an element disposed in a cell region 11 in the electronic device as shown in FIGS. 1A to 1D will be described later.

At least a cell-disposed portion of the cell region 11 is maintained in an atmosphere of vacuum by a cap body. The element provided on the cell region may include an infrared sensor, pressure sensor, acceleration sensor, rate-of-flow sensor, vacuum transistor, or the like.

Infrared sensor can be divided into two broad categories: a thermal type of sensor such as a bolometer, pyroelectric sensor, and thermopile, and a quantum type of sensor using PbS, InSb, HgCdTe, or the like. Some bolometers use polycrystalline silicon, Ti, TiON, $VO_x$ or the like. Some thermopiles use the Zeebeck effect induced at PN junction, and some of the other use the transient characteristics of a forward current flowing through PN diode or the like. Some pyroelectric infrared sensors use a change in dielectric constant of materials such as PZT, BST, ZnO, and $PbTiO_3$. A quantum type of infrared sensor detects a flow of current produced by electron excitation. These infrared sensors in general have characteristics improved when sealed in an atmosphere of vacuum or an atmosphere of inert gas within a cap body.

For pressure sensors and acceleration sensors, it is known that their characteristics are improved when they are sealed in an atmosphere of vacuum or inert gas by a cap body, because the sensitivity thereof is improved when the viscosity resistance of air is reduced.

Also, the number of elements disposed in one cell region of sensors of these types may be one or plural. Further, a switching element (transistor) may be provided in the cell region together with an element having characteristics improved by a higher degree of vacuum, as required.

—First Example of Basic Structure—

Figure 1A:
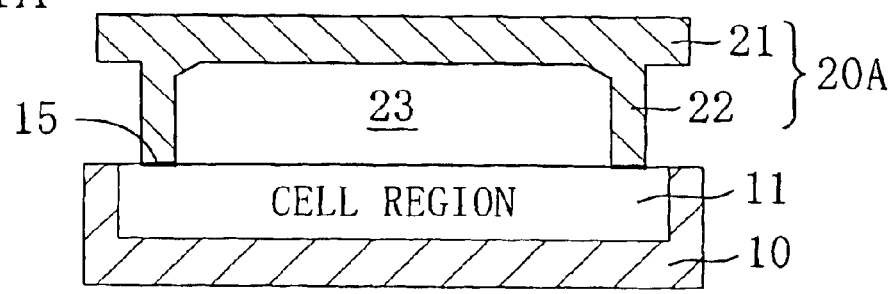
FIGS. 1A to 1D are cross-sectional views for schematically showing an example of basic structure of an electronic device according to the present invention.
Figure 1B:
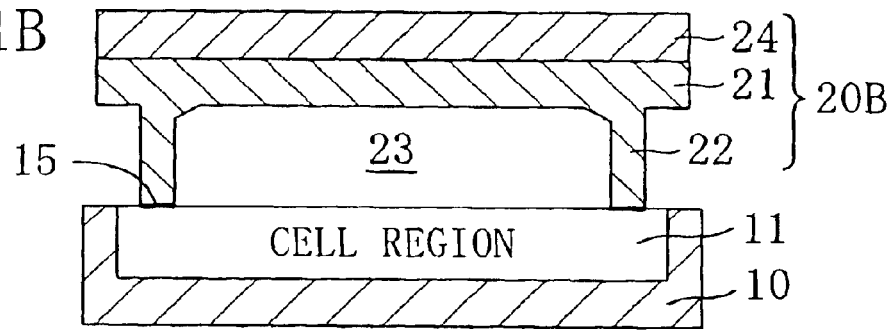

As shown in FIG. 1A, an electronic device according to the first example of basic structure comprises a main body substrate 10 formed of a Si wafer, and a cap body 20A formed of a Si wafer for sealing a desired area of the main body substrate 10 in an atmosphere of reduced pressure. The main body substrate 10 is provided with a cell region 11 in which a single element such as an infrared sensor and a circuit for sending signals to the element are disposed. On the other hand, the cap body 20A comprises a substrate portion 21 of silicon and a drum portion 22 enclosing a recess portion to provide a cavity portion 23 held in the atmosphere of vacuum. That is, by using various joining methods described later, a portion of the cell region of the main body substrate 10 and the drum portion 22 of the cap body 20A are joined to each other to form a ring-shaped joining portion 15 for sealing the cavity portion 23 to be held in the atmosphere of reduced pressure. Thereby, a configuration has been made to permit the elements in the cell region 11 to exhibit a desired function.

Herein, the structure of the recess portion includes one space formed by etching and removing a portion of the flat substrate to a given depth and another space enclosed with the drum portion configured by a closed-loop-like wall existing on the flat substrate. FIG. 1A discloses only a recess portion configured by the space enclosed with the drum portion 22. However, according to the invention, the structure of the recess portion formed in the main body substrate or in the substrate for use in the cap or in both the substrates before the cavity portion is formed is not limited to the form shown in FIG. 1A. This is the same in each example of basic structure and in each embodiment, as described below.

Also, as the methods for forming a drum portion enclosing the recess portion, one method removes the other region except for a closed-loop-like region left in a flat substrate to a given depth to form a drum portion, and another method builds up a closed-loop-like wall on a flat substrate to form a drum portion. Both the methods may be used for the invention.

—Second Example of Basic Structure—

Figure 2A:
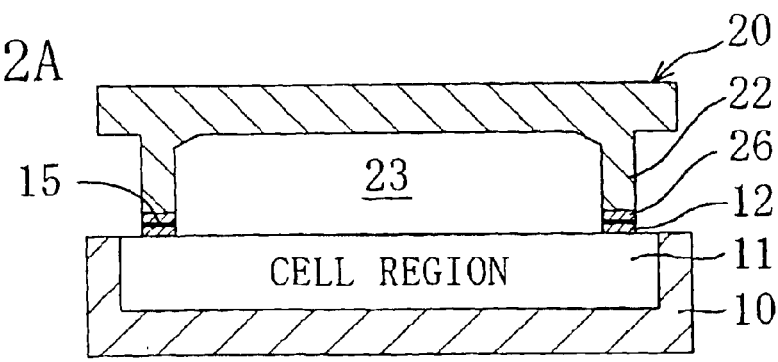
FIGS. 2A to 2D are cross-sectional views for schematically showing example structures of a joining portion for maintaining the electronic device of the present invention under vacuum.
Figure 2B:
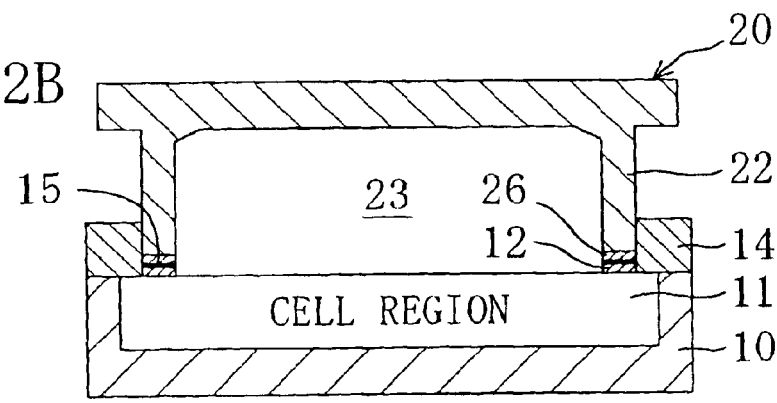

As shown in FIG. 2B, a cap body 20B in an electronic device according to the second example of basic structure comprises a Ge filter portion 24 of Ge having a thickness of 3 $\mu$m, in addition to the substrate portion 21 and the drum portion 22 enclosing a recess portion to provide the cavity portion 23 held in an atmosphere of reduced pressure. The main body substrate 10 in the second example of basic structure has the same structure as the main body substrate 10 in the first example of basic structure. In this case, the substrate portion 21 easily transmits light of a wavelength not shorter than about 0.8 $\mu$m (infrared light). In contrast to this, the Ge filter portion 24 can transmit only light of a wavelength not shorter than about 1.4 $\mu$m (infrared light) and shields a wavelength range, near to visible light, having wavelengths not longer than 1.4 $\mu$m.

Therefore, by applying the second example of basic structure to a device having an infrared sensor built in the cell region 11, it is possible to prevent false detection resulting from a change in the amount of current flowing through transistors or the like which change is caused by the incidence of light near to visible light. This is effective because infrared sensors are particularly used for detecting human bodies and animals during the night and light near to visible light from cars and illumination may excite carriers in the active region of transistors in electronic circuits, thus causing a reduction in a detection margin due to superimposition of background signals.

Also, in order to epitaxially grow a layer of Ge on a silicon wafer, after epitaxially growing layers of $Si_{1-x}Ge_x$ on the silicon wafer such that the Ge component ratio x may change from 0 to 1, a Ge layer of a predetermined thickness can be epitaxially grown thereon.

By the way, after layers of $Si_{1-x}Ge_x$ are epitaxially grown on the Ge layer such that the Ge component ratio x may change from 1 to 0, a Si layer can be epitaxially grown thereon by a predetermined thickness. If the processs thereafter are advanced with the Ge layer exposed, it is fear that the manufacturing apparatuses may be contaminated by Ge, and if the surface layer is configured by a Si layer, a process for manufacturing electronic devices can be applied to the next processing for forming Fresnel lens. From these points of view, the Ge layer is preferably not exposed on a top surface.

Also, the layer functioning as a filter may be configured by a material including elements other than Ge. Particularly, materials having a narrower band-gap than that of Si 1.1 eV can absorb light in the range of wavelengths longer than 0.8 $\mu$m (mainly near infrared light), and thus can avoid problems caused by carries excited in impurity-diffused layer of transistors or the like disposed in cells.

—Third Example of Basic Structure—

Figure 1C:
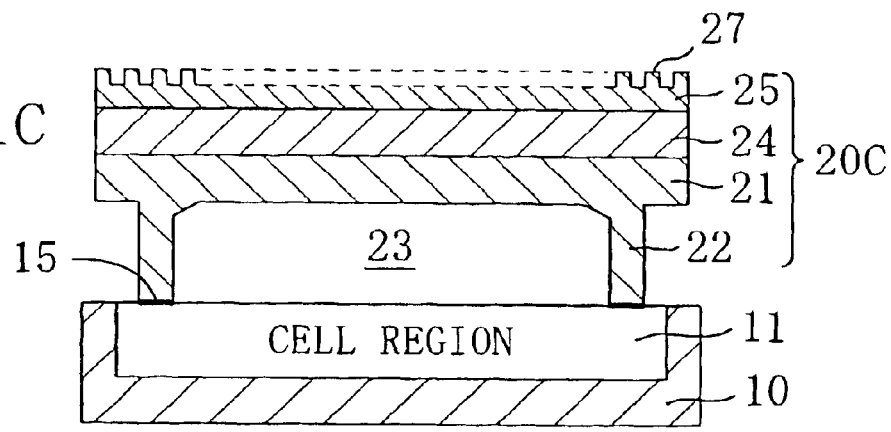

As shown in FIG. 1C, an electronic device according to the third example of basic structure have a cap body 20C which comprises a Ge filter portion 24 and a Si layer having a grating pattern 27 engraved in the surface thereof, which pattern provides a Fresnel lens having the function of a convex lens, in addition to the substrate portion 21 and the drum portion 22 enclosing a recess portion to provide the cavity portion 23 held in an atmosphere of reduced pressure. The structure of the main body substrate 10 in the third example of basic structure is the same as the structure of the main body substrate 10 in the first example of basic structure. For the same reason as in the second example of basic structure, the third example of basic structure is suitable for a device having an infrared sensor built therein, and particularly it can effectively focus light on the existing position of a resistance body by using the function of a concave lens provided by grating pattern on the surface thereof. Therefore, the third example can provide an electronic device suitable for miniaturization and higher performance.

In the earth's atmosphere, there is wavelength regions called "atmospheric windows" at the wavelength ranges of electromagnetic waves of 3 $\mu$m to 5 $\mu$m and 8 $\mu$m–10 $\mu$m, which have high transmission factor for infrared radiation. Although infrared radiation of these regions passes through the atmosphere, wavelength ranges except for the atmospheric window is difficult to detect due to disturbance noises. Further, the infrared radiation emitted from human bodies and the bodies of animals has a wavelength range of 3 $\mu$m–10 $\mu$m. Therefore, the provision of a Ge filter layer 24 permits infrared sensors to accurately detect target humans and animals, while avoiding false detection caused by light in the range of 0.8 $\mu$m–1.4 $\mu$m near to visible light.

In addition, instead of the Ge filter, a SiGe filter (composition $Si_{1-x}Ge_x$) may be provided. In this case, a frequency band of infrared radiation to be removed is shifted in the range of 0.8 $\mu$m–1.4 $\mu$m according to the component ratio x of Ge. For this reason, the provision of a SiGe filter provides an advantage that a cutoff frequency band can be adjusted as desired.

—Fourth Example of Basic Structure—

Figure 1D:
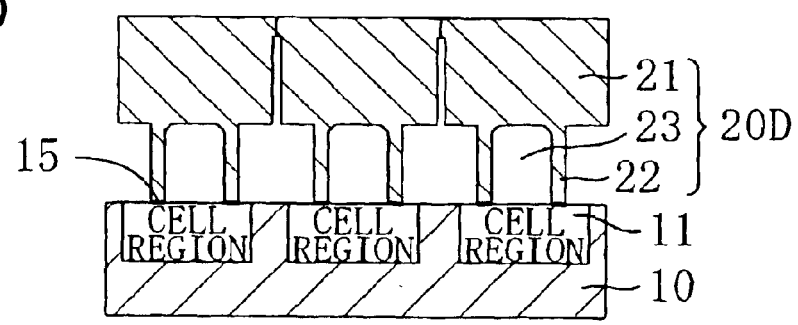

As shown in FIG. 1D, an electronic device according to the fourth example of basic structure comprises the main body substrate 10 formed of Si, and a cap body 20D formed of Si for sealing a desired area of the main body substrate 10 in an atmosphere of reduced pressure. The main body substrate 10 is provided with a large number of cell regions 11 in which one element such as an infrared sensor and a circuit for feeding signals to the element are disposed. On the other hand, the cap body 20D comprises the substrate portion 21 and a large number of the drum portions 22 for enclosing a recess portion to provide the cavity portion 23 held in an atmosphere of reduced pressure. That is, by using various joining methods described later, a portion of each cell region 11 of the main body substrate 10 and each drum portion 22 of the cap body 20D are joined to each other in an atmosphere of reduced pressure to form a closed-loop-like ring-shaped joining portion 15. Thereby, each cavity portion 23 is held in the atmosphere of reduced pressure, and thus a configuration is made to allow the elements in each cell region 11 to exhibit a desired function.

Further, a depth of cut for partitioning the substrate portion 21 into each cell region is provided in the substrate portion 21, and thus the substrate portion 11 is separately divided at the depth-of-cut portion during joining or after joining. However, it may be not divided at the depth-of-cut portion. In this case, the configuration is made such that the push pressure applied on the joining portion in each cell can be made as uniform as possible by elastic deformation induced at the depth-of-cut portion, even if delicate differences in the push pressure (force for pressure bonding) can be caused by the different thickness of joining portion of each cap body and the deformation of the wafer tend to cause.

Also, in FIG. 1D, although the cap body 20D has only the substrate portion 21, it may comprise a Ge cap portion. In addition, it may comprise a lens function such as a Fresnel lens on the surface thereof.

FIGS. 1A to 1D illustrates the joining between the main body substrate and the cap body as realized by Si to Si junction. However, generally, use of the metal to metal junction can make the manufacturing process easier than the Si to Si junction. Thus, hereinafter, example structures of joining portion will be described.

EXAMPLE STRUCTURES OF JOINING PORTION

FIGS. 2A to 2D are cross-sectional views for schematically showing example structures of the joining portions for holding the electronic device of the invention under vacuum.

Here, the meanings of the joining using hydrogen bonding, the joining using metallic bonds and the room temperature joining which are used in the invention will be described.

The hydrogen bonding is made under a low pressure of the range from normal pressure to $10^{-4}$ Pa and with heating in some cases and without heating in other cases. The metallic bonds are made under the application of pressure to about 1000 Pa in some cases and under a ultra-low vacuum lower than $10^{-8}$ Pa in other cases. Further, the metallic bonds are made by heating at high temperature in some cases and by not heating. In the room temperature joining, the materials to be joined are directly joined to each other at an atomic level without heating. This joining is performed in the range from a relatively low vacuum of about $10^{-4}$ Pa to an ultra-low vacuum of a pressure lower than $10^{-8}$ Pa. The room temperature joining can join materials to be joined except for metal to each other, such as a metal to metal, ceramic to ceramic, and silicon to silicon junction. Also, the room temperature joining includes direct joining at an atomic level (performed in the range of $10^{-6}$–$10^{-9}$) and joining using metallic bonds.

—First Example Strucutre of the Joining Portion—

As shown in FIG. 2A, in the first example structure, a ring-shaped film 12 of a joining material of metal (for example, aluminum (Al)) is provided on the main body substrate 10, and a ring-shaped film 26 of a joining material of metal (for example, Al) is provided on the end of the drum portion 22 of the cap body 20. Thus, ring-shaped films 12 and 26 are joined to each other in an atmosphere of reduced pressure by using hydrogen bonding or the like to form the ring-shaped joining portion 15, thereby sealing the cavity portion 23 on the cell region 11 under an atmosphere of reduced pressure.

Also, in the first example structure of the joining portion and the second-fourth example structures of the joining portion described later, joining materials of metal includes, in addition to Al, metals such as In, Cu, Au, Ag, Ti, W, Co, Ta, and Al—Cu alloy, or alloys. It is possible to use metal to metal, metal to alloy, and alloy to alloy metallic bonds among these metals and alloy. Further, materials other than metal may be used as the joining material. For example, it is possible to use silicon oxide film-silicon oxide film, silicon oxide film-Si, and Si—Si hydrogen bonding.

When making the joining using these metallic bonds and hydrogen bonding or the room temperature joining, the joining can be easily made under an atmosphere of low temperature and low vacuum according to the invention. At this point, these joining can be said to be suitable for the invention.

Further, in the first example structure of the joining portion and the second-fourth example structures of the joining portion described later, each ring-shaped film 12, 26 does not need to is provided to use Si to Si hydrogen bonding.

—Second Example Structure of the Joining Portion—

As shown in FIG. 2B, in the second example structure of the joining portion, a ring-shaped protrusion portion 14 of an insulating film is provided on the main body substrate 10, and a ring-shaped film 12 is provided on the cell region 11 within the ring-shaped protrusion portion 14 in the cell region. On the other hand, the ring-shaped film 26 is provided on the end of the drum portion 22 of the cap body 20. Thus, in an atmosphere of reduced pressure, the ring-shaped films 12 and 26 are bonded to each other to form the ring-shaped joining portion 15, while the drum portion 22 is being fitted into the ring-shaped protrusion portion 14. Thereby, the cavity portion 23 on the cell region 11 is sealed in an atmosphere of reduced pressure. That is, the ring-shaped protrusion portion 14 functions as an engagement portion for engaging with the drum portion 22. However, although the main body substrate 10 is provided with a recess portion having the inside surface engaging with the outside surface of the drum 22, the outside surface of the engagement portion of the main body substrate may be engaged with the inside surface of the drum portion 22.

Since this example structure of the joining portion ensures that the cap body 20 can be fixed on the main body substrate 10, it is a structure suitable for an electronic device having a plurality of cell regions 11.

—Third Example of the Joining Portion —

Figure 2C:
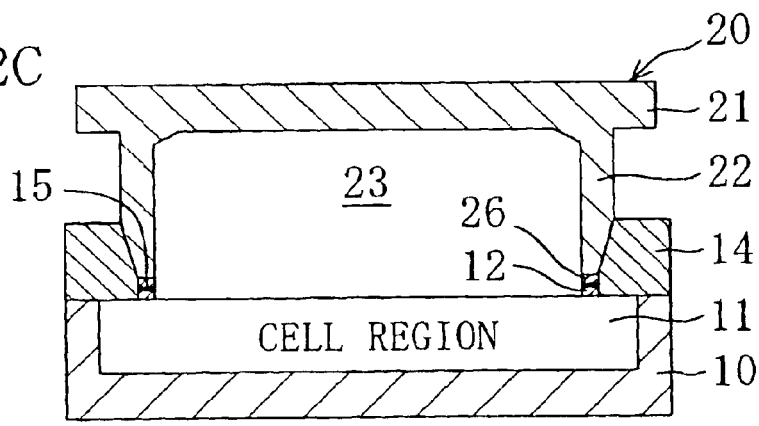

As shown in FIG. 2C, in the third example structure of the joining portion, a ring-shaped protrusion portion 14 configured by a insulation material having the tapered inside surface is provided on the main body substrate 10, and a ring-shaped film 12 is provided on the cell region 11 within the ring-shaped protrusion portion 14 in the cell region. On the other hand, the outside surface of the drum portion 22 of the cap body 20 is formed into a tapered surface having the same slope as the tapered inside surface of the ring-shaped protrusion portion 14, and further the ring-shaped film 26 is provided on the end of the drum portion 22. Thus, in an atmosphere of reduced pressure, the ring-shaped films 12 and 26 are joined to each other to form the ring-shaped joining portion 15, while the inside surface of the ring-shaped protrusion portion 14 is being fitted on the outside surface of the drum portion 22. Thereby, the cavity portion 23 on the cell region 11 is sealed in an atmosphere of reduced pressure. In this case, the ring-shaped protrusion portion 14 also functions as an engagement portion engaging with the drum portion 22. However, a recess portion having the inside surface engaging with the outside surface of the drum portion 22 may be provided in the main body substrate 10 as the engagement portion. Also, the outside surface of the engagement portion of the main body substrate may be engaged with the inside surface of the drum portion 22.

According to this example structure of the joining portion, the cap body 20 can be easily aligned on the main body substrate 10, and thus it is a structure particularly suitable for an electronic device having a plurality of cell regions 11.

—Fourth Example Structure of the Joining Portion—

Figure 2D:
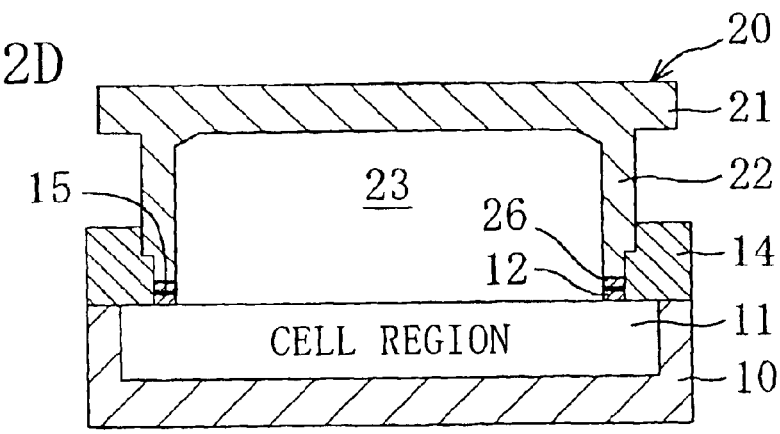

As shown in FIG. 2D, in the fourth example structure of the joining portion, a ring-shaped protrusion portion 14 configured by of a insulation material having the stepped inside surface is provided on the main body substrate 10, and a ring-shaped film 12 is provided on the cell region 11 within the ring-shaped protrusion portion 14 in the cell region. On the other hand, the outside surface of the drum portion 22 of the cap body 20 is formed into a stepped surface which can engage with the stepped inside surface of the ring-shaped protrusion portion 14, and further the ring-shaped film 26 is provided on the end of the drum portion 22. Thus, in an atmosphere of reduced pressure, the ring-shaped films 12 and 26 are joined to each other to form the ring-shaped joining portion 15, while the inside surface of the ring-shaped protrusion portion 14 is being fitted into the outside surface of the drum portion 22. Thereby, the cavity portion 23 on the cell region 11 is sealed in an atmosphere of reduced pressure.

In this case, the ring-shaped protrusion portion 14 also functions as an engagement portion engaging with the drum portion 22. However, a stepped outside surface may be provided on the outside of the drum portion 22 and a recess portion having the inside surface engaging with this stepped outside surface may be provided in the main body substrate 10 as the engagement portion. Also, a stepped inside surface may be provided inside the drum portion 22 and thus the engagement portion having the stepped outside surface engaging therewith may be provided on the main body substrate.

According to this example structure of the joining portion, the cap body 20 can be easily aligned on the main body substrate 10, and thus it is a structure particularly suitable for an electronic device having a plurality of cell regions 11.

(Electrical Connection Structure)

Figure 3A:
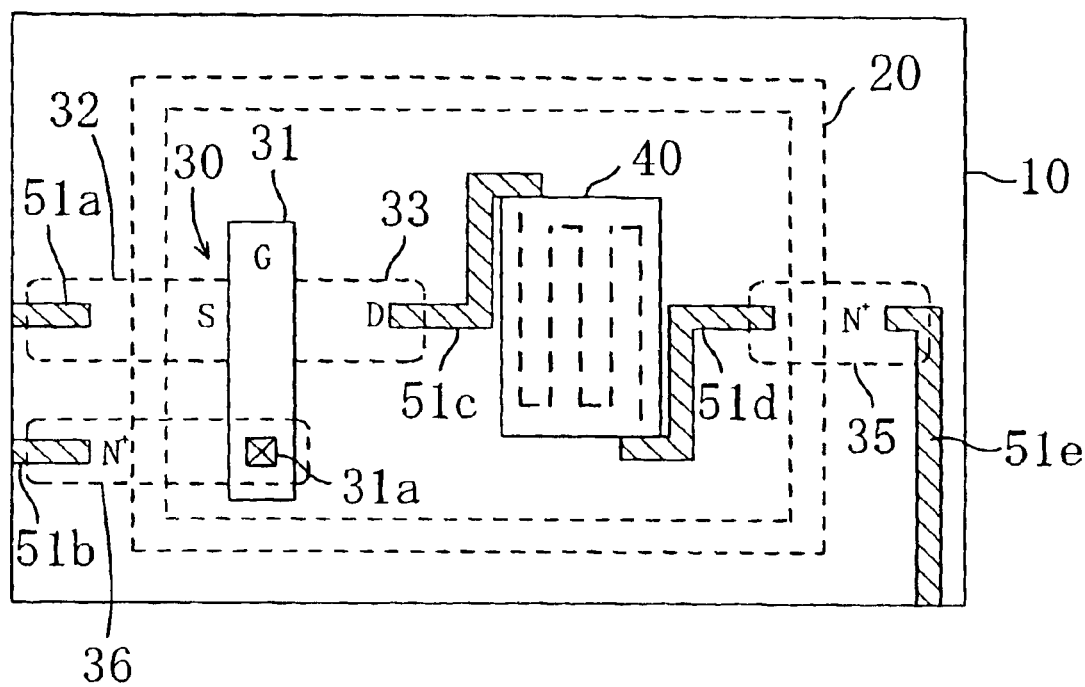
FIGS. 3A and 3B are a plan view and a cross-sectional view for showing an example of an electrical connection structure suitable for the electronic device of the present invention, respectively.
Figure 3B:
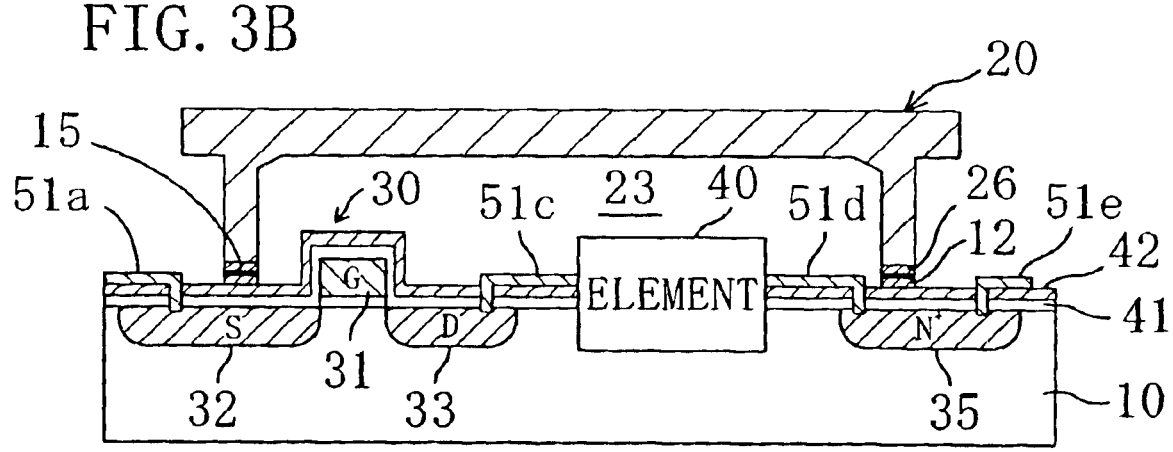

FIGS. 3A and 3B are a plan view and a cross-sectional view for showing an electrical connection structure suitable for the electronic device according to the invention, respectively. Herein, FIG. 3A is a plane structure of the electronic device with its cap body removed.

As shown in FIGS. 3A and 3B, the main body substrate 10 and the cap body 20 are mechanically connected to each other by the joining between ring-shaped films 12 and 26, and the cavity portion 23 is formed between both of them. Also, on the main body substrate 10, an element 40 shown by a broken line such as a bolometer and a N channel type of switching transistor 30 having a gate electrode 31, source region 32 and a drain region 33 are provided. This switching transistor 30 controls the electrical connection between the element 40 and an external circuit. Thus, the electrical connection between the element 40 disposed on the area sealed by the cap body 20 and the external circuit are on-off controlled. The drain region 33 and gate electrode 31 of this switching transistor 30 are provided in the area enclosed by the cap body 20. As shown in FIG. 3A, the source region 32 is formed in the main body substrate 10 to extend across each ring-shaped film 12, 26. Also, in the area located directly below the drum portion of the cap body 20, there are provided impurity-diffused layers (N+ type diffused layer) 32, 35 and 36 for functioning as wiring, which are formed so as to cross each ring-shaped film 12 and 26 in the main body substrate 10.

Also, an interlayer insulating film 41 of silicon oxide covering the switching transistor 30 and the main body substrate 10 and a passivation film 42 covering the interlayer insulating film 41 are formed above the main body substrate 10. Further, on the main body substrate 10, there are provided a contact 31a for establishing a connection between the gate electrode 31 of the switching transistor 30 and the impurity-diffused layer 36, a first wiring 51a for connecting the source region of the switching transistor 30 and an external circuit (not shown) to each other, a second wiring 51b for connecting the impurity-diffused layer 36 and an external circuit (not shown) to each other, a third wiring 51c for connecting the drain region 33 of the switching transistor 30 and the element 40 to each other, a fourth wiring 51d for connecting the element 40 and the impurity-diffused layer 35 to each other, and a fifth wiring 51e for connecting the impurity-diffused layer 35 and an external circuit (not shown) to each other. That is, the element 40 and the switching transistor 30 are connected through the third wiring 51c and the drain region 33. Also, the element 40 is connected to an external circuit through the fourth wiring 51d, the impurity-diffused layer 35 and the fifth wiring 51e.

By choosing such an electrical connection structure, no metal wiring is present directly below the ring-shaped joining portion 15 existing between the ring-shaped film 26 of the cap body 20 and the ring-shaped film 12 of the main body substrate 10. Therefore, it is possible to effectively prevent the wiring from being ruptured and broken by a push pressure (pressure bonding force) for establishing the junction between the ring-shaped films, and to prevent the reliability of connection from being deteriorated due to the wiring partially ruptured by the pressure. Also, since the interlayer insulating film 41 can be easily covered by the passivation film 42 within the cavity portion 23, it is possible to prevent gas or the like generated from the interlayer insulating film 41 from entering into the cavity portion 23, thereby permitting the cavity portion 23 to be held in a good vacuum.

Further, the external circuit may be formed in an area on the main body substrate not covered by the cap body 20, or may be provided in an area different from the area in which an infrared sensor is provided.

Also, in the structure of the electronic device shown in FIGS. 3A and 3B, the cap body 20 is provided so as to enclose the element 40 and switching transistor 30 (particularly drain region 33) in the cell region. Therefore, by mounting a Ge layer having a filter function on the cap body 20, it is possible to avoid the occurrence of possible problems caused by the carriers excited in the drain region of the switching transistor 30 in the cell region. Also, Instead of providing a Ge layer on the cap body 20, a filter of Ge or the like may be provided at any appropriate position where the filter can prevent the incidence of light into the switching transistor 30. Further, if a filter portion such as a Ge layer is not provided on the cap body 20, it is not necessary to enclose the switching transistor 30 (particularly drain region) with the cap body 20.

Embodiment 1

Next, description will be made for an embodiment 1 applying the electronic device according to the invention to a discrete type of infrared sensor.

Figure 4A:
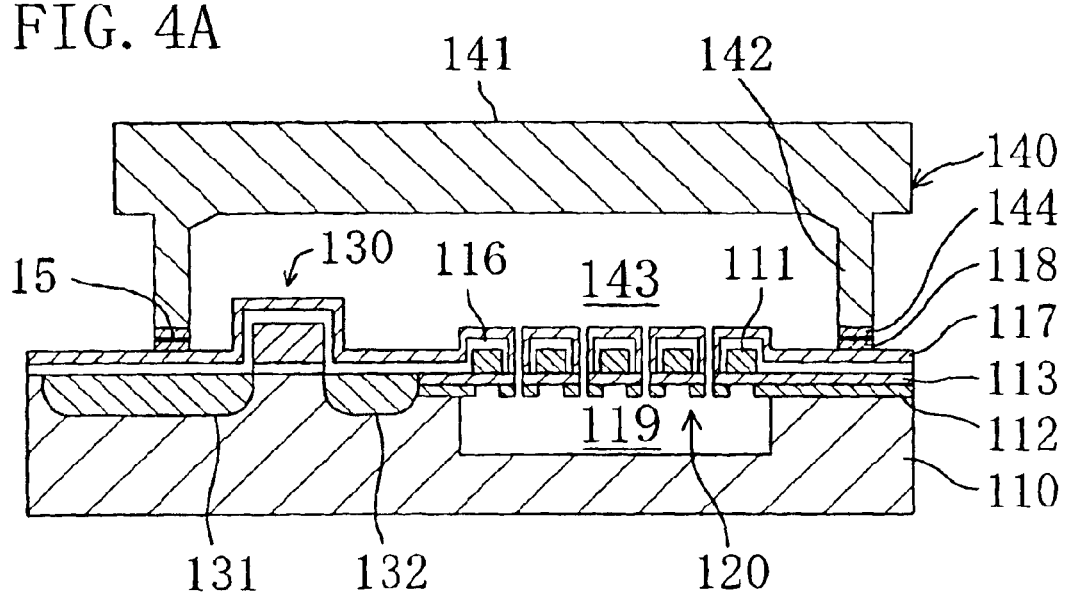
FIGS. 4A and 4B are a cross-sectional view and an electrical circuit diagram of an infrared sensor according to the present invention, respectively.
Figure 4B:
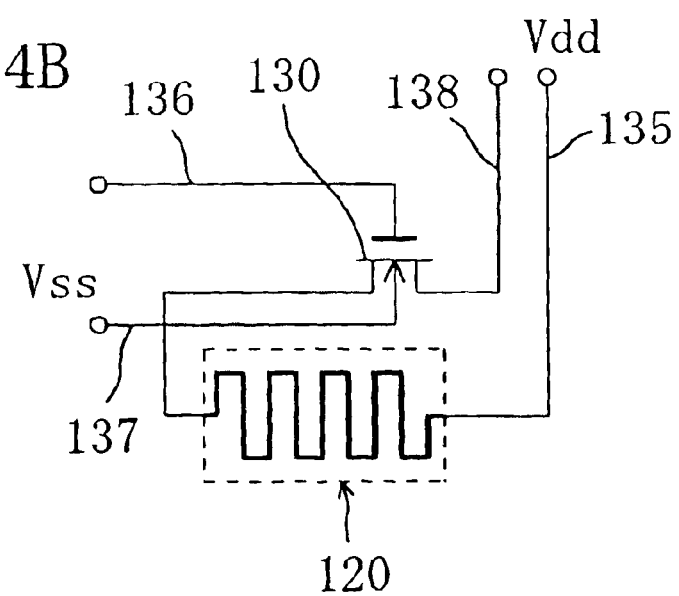

FIGS. 4A and 4B are a cross-sectional view and an electrical circuit for illustrating an infrared sensor according to Embodiment 1 of the invention, respectively.

As shown in FIG. 4A, the infrared sensor of the present embodiment comprises a Si substrate 110 having a thickness of 300 $\mu$m, a resistance element (bolometer) 120 provided on the Si substrate 110, a switching transistor 130 provided on the Si substrate 110 for turning on and off a current to the resistance element 120, and a cap body 140 for holding the area having the resistance element 120 placed thereon in an atmosphere of reduced pressure. The total size of this infrared sensor is about several mm. Above the Si substrate 110, there are provided the resistance body 111 patterned into a fanfold (Z-fold)-shape, a silicon nitride film 112 and a silicon oxide film 113 supporting the resistance body 111, a BPSG film 116 and a passivation film (silicon nitride film) 117 covering the resistance body 111. The silicon oxide film 113, BPSG film 116 and silicon nitride film 112 are patterned into a fanfold-shape together with the resistance body 111, and extend to above the silicon substrate 110. Cavity portions 119 and 143 held under vacuum are provided below and above the fanfold-shape-like resistance body 111, silicon oxide film 113, BPSG film 116, and passivation film 117, respectively. The cavity portions 119 and 143 are connected with each other through a gap and a side space in the region where the silicon oxide film 113, BPSG film 116 and silicon nitride film 112 are integrated. Thus, the whole of the resistance body 111, silicon oxide film 113, BPSG film 116, passivation film 117, and silicon nitride film 112 is constructed in the fanfold-shape to hang across above the cavity portion 119.

The materials of the resistance body 111 may include Ti, TiO, polycrystalline silicon, Pt or the like, and both of them can be used therefor.

Also, a ring-shaped film 118 made of a soft metallic material (such as aluminum) is provided on the region of the passivation film 117 which is located below the drum portion 142 of the cap body 140, and also a ring-shaped film 144 of a soft metallic material (such as aluminum) is provided on the end of the drum portion 142. Thus, the ring-shaped joining portion 15 formed between both the joining portions 118 and 142 holds the cavity portions 119 and 143 existing between the cap body 140 and the Si substrate 110 in an atmosphere of reduced pressure (vacuum). That is, by the existence of the cavity portion 119 and 143, the resistance body 111 is configured to be thermally insulated from the Si substrate 110, thereby maintaining a high efficiency of converting from infrared radiation to heat.

Also, the substrate portion 141 of the cap body 140 are configured by a Ge layer having a thickness of about 3 $\mu$m and a Si layer having a thickness about 1 $\mu$m epitaxially grown on a silicon substrate having a thickness of about 300 $\mu$m, in which the surface of the Si layer is shaped into a Fresnel lens. The drum portion 142 of the cap body 140 forms a cavity portion having a depth more than several $\mu$m. By the way, A region of the cap body corresponding to a window portion may be made thinner by etching or the like.

Also, the switching transistor 130 has the source region 131, drain region 132, and gate electrode 133. Thus, the drain region 132 is disposed below the drum portion 142 of the cap body 140, and the drain region 132 is configured to function as wiring for communicating signals between the resistance body 111 sealed under vacuum and an external member.

Further, although not shown in FIG. 4A, a Peltie element for cooling the resistance element is mounted on the lower surface of the Si substrate 110. This Peltie element uses heat-absorbing action accompanying the movement of carriers passing through a Schottky contact portion. In this embodiment, various Peltie elements having well-known structures may be used.

As shown in FIG. 4B, one end of the resistance body 111 is connected to the wiring 135 for feeding a power supply voltage Vdd, and the other end of the resistance body 111 is connected to the drain region 132 of the switching transistor 130. Also, an ON-OFF switching signal is input to the gate of the switching transistor 130 through the wiring 136, and the source of the switching transistor 130 is connected to a detection portion (not shown) for detecting the amount of infrared radiation received by the resistance body 111 through wiring 138, the other end of which connected to a standard resistance. Further, the substrate region of the switching transistor 130 is connected to ground for feeding a ground voltage Vss through wiring 137. That is, when the temperature of the resistance body 111 changes according to the amount of infrared radiation and thus its resistance value also changes, the potential of the wiring 138 changes and thereby the amount of infrared radiation is detected from an change in the potential.

On the other hand, for a discrete type of infrared sensor, an operational amplifier for amplifying output from a bolometer may be provided on the substrate, as well. In this case, the operational amplifier may be positioned on the region sealed by the cap body in addition to the bolometer and switching transistor of the present embodiment.

Next, one example of a process for manufacturing the infrared sensor according to the invention will be described. FIGS. 5A to 5F are cross-sectional views for showing process steps for manufacturing the infrared sensor according to Embodiment 1 (see FIGS. 4A, 4B) of the invention. Also, FIGS. 6A to 6E is a plan view for showing process steps for forming a bolometer and the peripheral region thereof. Then, FIG. 5A is a cross-sectional view taken along a line Va—Va shown in FIG. 6C, FIG. 5B is a cross-sectional view taken along a line Vb—Vb shown in FIG. 6D, and FIG. 5D is a cross-sectional view taken along a line Vd—Vd shown in FIG. 6E.

Figure 13:
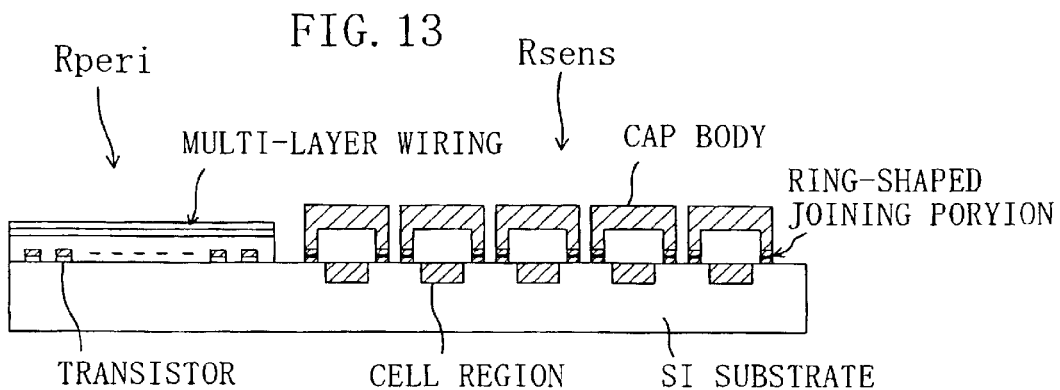
FIG. 13 is a cross-sectional view for showing the whole structure of the infrared sensor according to Embodiment 1 and embodiment 2 of the present invention.

FIG. 13 is a cross-sectional view for showing the whole structure of the infrared sensor according to the invention. As shown in the same figure, the infrared sensor comprises a sensor region Rsens configured as disposing cell regions having a resistance element such as a bolometer and a switching transistor in a array-like arrangement, and a peripheral circuit region Rperi (control circuit) configured as disposing transistors for controlling current and operation of the cell region (see FIG. 9). However, in the present embodiment, only the changes of structure of the sensor region Rsens in the manufacturing process will be described. The changes of structure of the peripheral circuit region Rperi in the manufacturing process are independent of the characteristics of the invention, and various well-known CMOS processes may be used therefor.

Figure 6A:
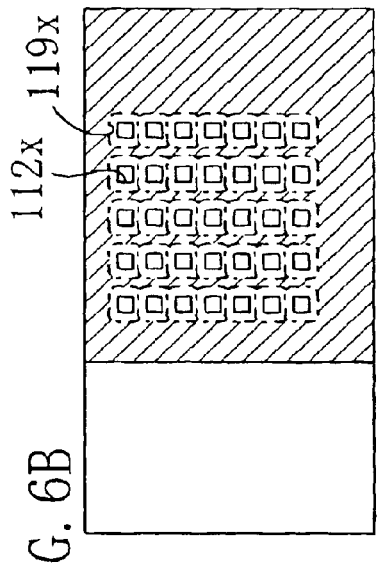
FIGS. 6A to 6E are plan views for showing process steps for forming a bolometer and the peripheral area thereof.
Figure 6B:
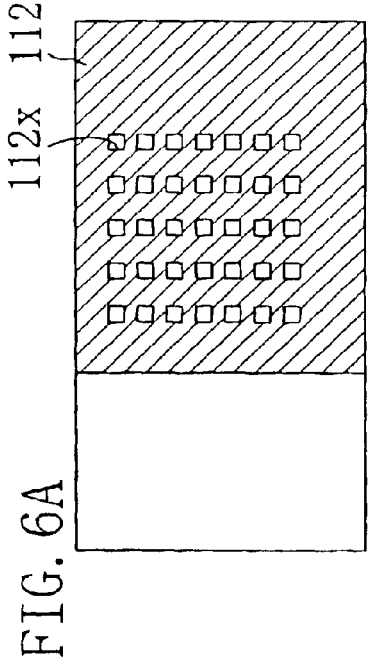
Figure 6C:
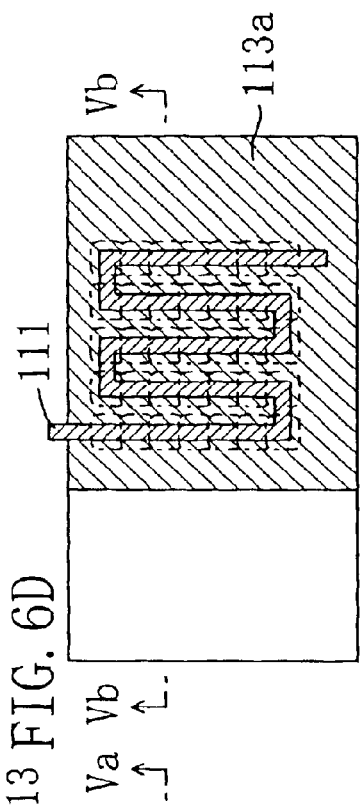
Figure 6D:
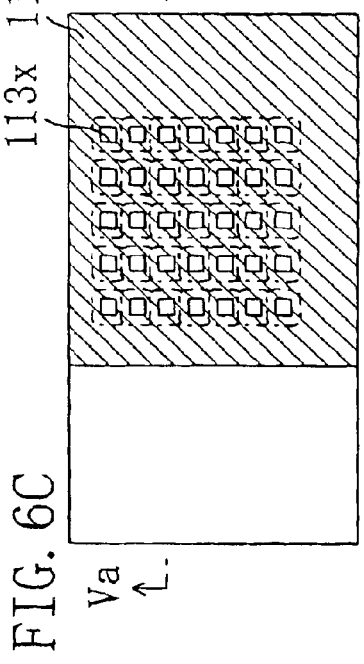

First, in the process step shown in FIG. 5A, a flat plate-like silicon nitride film having a large number of openings 112x as shown in FIG. 6A is formed on the Si substrate 110. Next, the silicon substrate 110 is dry-etched using this silicon nitride film 112 as a mask to form holes with the bottoms directly below the openings 112x, and thereafter the holes are wet-etched to be enlarged in the vertical and lateral directions. Thereby, cavity portions 119x having a depth of about 1 $\mu$m are formed as shown in FIG. 6B. At this time, FIG. 5A shows that a wall portion 110x exists between adjacent small cavity portions 119x without exception, but the holes 112x closed to each other may be joined together in the lower portion thereof to form relatively large cavity portions.

Then, when a polycrystalline silicon film 113 is formed on the silicon nitride film 112, the polycrystalline silicon film 113 does not completely cover the holes 112x, so that small openings 113x also are formed in the polycrystalline silicon film 113, as shown in FIG. 6C.

Next, in the process step shown in FIG. 5B, the polycrystalline silicon film 113 is thermally oxidized to form a silicon oxide film 113a, and thus the openings 113x are closed by the silicon oxide film 113a. Further, after a resistance body film of a conducting material such as Ti is deposited on the silicon oxide film 113a, this film is patterned, thus forming a resistance body 111 having a fanfold-shape as shown in FIG. 6D.

After that, after depositing a polycrystalline silicon film on the substrate, the polycrystalline silicon is patterned to form the gate electrode 133. Then, impurity atoms (for example, n-type impurity atoms such as arsenic and phosphorus) are implanted into the region positioned along both sides of the gate electrode 133, thus forming the source region 131 and drain region 132.

At this time, MIS transistors in the peripheral transistor region (not shown) except for the sensor region are also formed at the same time. After that, although not shown, several layers of interlayer insulating films and wiring layers (that is, multi-layer wiring layers) are formed on the substrate to cover members already formed in the sensor region and the transistor region. However, in the present embodiment, the wiring layer is not formed in this process step and only several layers of interlayer insulating films are deposited in the sensor region.

Next, in the process step shown in FIG. 5C, a silicon oxide film 116 is deposited on the interlayer insulating film of the sensor region to cover the whole upper surface of the substrate including the gate electrode 133 and the resistance body 111.

Figure 6E:
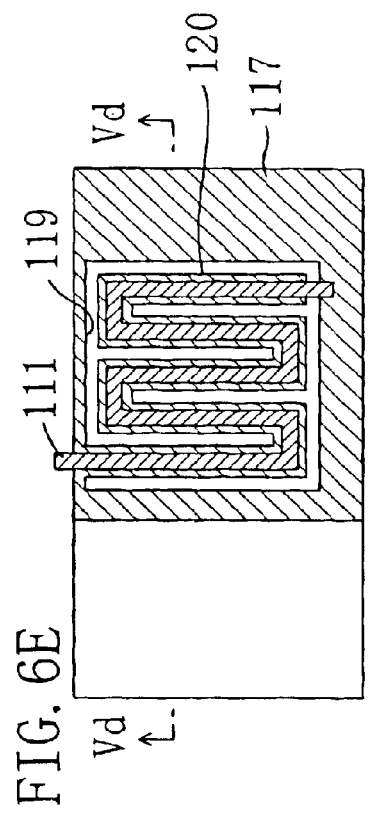

Next, in the process steps shown in FIG. 5D and FIG. 6E, the part of the silicon oxide 116 located in the gap portions of the resistance body 111 is removed. At this time, part of the silicon oxide film 116 remains covering the resistance body 111. After that, a passivation film 117 of silicon nitride is deposited on the substrate. The passivation film 117 is to prevent water and moisture from entering into the resistance body 111 and the switching transistor 130. After that, it is performed to remove the portions of the passivation film 117, silicon oxide film 113, and silicon nitride film 112 that are located in the gap portions of the resistance body 111. Thereby, the forming of a bolometer 120 is completed. At this time, the wall portions 110 existing between the cavity portions 119x are also removed, and thus a large cavity 119 is formed. Then, the cavity portion 119 communicates with external space through openings Het formed by this etching. Also, the resistance body 111 remains packaged by the silicon oxide film 113, silicon oxide film 116, and passivation film 117.

On the other hand, in the peripheral transistor region not shown, the passivation film 117 may be formed to cover the top layer of the multi-layer wiring. This passivation film is extremely commonly formed in the processes of manufacturing LSI's. In the embodiment, the passivation film 117 of the sensor region can be formed of the same silicon nitride film as the passivation film covering the peripheral transistor region in common process steps.

Next, in the process step shown in FIG. 5E, a ring-shaped film 118 of metal (aluminum (Al)) having a thickness of 600 nm and circularly enclosing the resistance body 111 and the switching transistor 130 is formed on the part of the passivation film 117 located in the peripheral region of the resistance body 111. At this time, part of the ring-shaped film 118 is positioned above the source region 131 of the switching transistor 130.

Also, although not shown in FIG. 5E, the wiring 51a–51e as shown in FIGS. 3A and 3B are formed. That is, after contact holes are formed so as to pass through the passivation film 117 and silicon oxide film 116 to reach the impurity-diffused layers (including the source and drain regions) and the bolometer resistance body 111, the wiring is formed to fill the contact holes and to extend on the passivation film.

Next, in the process step shown in FIG. 5F, a cap body 140 is prepared on a silicon substrate, where the cap body has a substrate portion 141 to provide a window for transmitting infrared radiation in the wavelength range not shorter than 1.4 $\mu$m, a drum portion 142 enclosing a recess portion and a ring-shaped film 144 of Al provided on the end of the drum portion 142. Then, by aligning the ring-shaped film 144 on the cap body 140 and the ring-shaped-film 118 on the Si substrate 110 to each other, both of them are joined to each other to form the ring-shaped joining portion 15. At this time, the whole cell region have nearly the same plane shape and circuit structure as shown in FIGS. 3A and 3B, respectively.

Herein, each ring-shaped film 118, 144 is formed by patterning an Al film deposited by sputtering. Then, after the ring-shaped films 118 and 144 are subjected to FAB (First Atom Beam) processing, that is, irradiated with Ar atoms, to expose dangling bonds on their surface, both films are joined to each other by pressure bonding. The detailed process of this joining will be described later.

Further, in the embodiment, although the description has been made particularly for the process steps for manufacturing an infrared sensor in which a resistance body called a bolometer is used, methods which can use the invention for forming a bolometer is not limited to these process steps for manufacturing. Also, the method can use another type of infrared sensor. In this case, a completely different process for manufacturing will be used. Whatever the case may be, since the characteristic of the invention is not for the structure of bolometers themselves, it will be omitted to describe the process steps of manufacturing where the invention is applied to another type of infrared sensor, a pressure sensor, and acceleration sensor.

Hereinbefore, according to the process steps of manufacturing shown in FIGS. 5A to 5F, the two following advantages are obtained.

First, in the process steps shown in FIG. 5D and FIG. 6E, the wall portions 110x existing between the cavity portions 119x are also removed to form a large cavity 119. Thus, pillars and walls connecting the upper resistance element 120 and the lower substrate region do not exist in the cavity portion 119, and therefore heat dissipation of the resistance element 120 can be made as little as possible, thereby permitting improvement of the detection sensitivity and detection accuracy of the infrared sensor.

Second, because the cavity portion 119 formed below the resistance element 120 communicates with the space within the cap 141 through the hole Het, the atmosphere of the cavity portion 119 has the same degree of vacuum as the atmosphere in the cap 141. That is, if the cavity portion 119 is isolated, the cavity portion 119 is sealed under the atmosphere in the oxidation step shown in FIG. 5B, and thus it is impossible to maintain the cavity portion 119 under a relatively high degree of vacuum. In contrast to this, in the embodiment, the degree of vacuum of the cavity portion 119 is the same as the degree of vacuum within the cap body 140, that is, the degree of vacuum when the ring-shaped joining portion 15 of the cap body 140 is formed (for example, a degree of vacuum in the range of approximately $10^{-2}$ Pa–$10^{-4}$ Pa). Therefore, it is possible to suppress thermal radiation from the infrared sensor, thereby permitting improvement of the detection sensitivity and detection accuracy of the infrared sensor.

However, in stead of removing all of the wall portions as in the embodiment, the wall portions and pillars may be partially remained. In this case, the advantages of forming the ring-shaped joining portion 15 by means of metallic bonds and hydrogen bonding, and the advantages of individually providing the cap bodies for each cell region can be exerted, as well.

Also, no mutual communication between the spaces of the cavity portion 119 and the cap body 140 may be possible. In this case, the advantages of forming the ring-shaped joining portion 15 by means of metallic bonds and hydrogen bonding, and the advantages of individually providing the cap bodies for each cell region can be exerted, as well.

—Method for Forming Cap Body—

FIGS. 7A to 7F are cross-sectional views for showing a method for forming the cap body used in the electronic device according to the present embodiment.

First, in the process steps shown in FIG. 7A, a cap wafer 150 is prepared by epitaxially growing a Ge layer and a Si layer on a silicon wafer in sequence. For epitaxial growth of a Ge layer having a thickness of about 3 $\mu$m on a silicon wafer, after a $Si_{1-x}Ge_x$ layer is grown on the silicon wafer such that the Ge component ratio x may change from 0 to 1 as described above, a Ge layer having a predetermined thickness is epitaxially grown on the $Si_{1-x}Ge_x$ layer. Further, after that, after a $Si_{1-x}Ge_x$ layer is grown on the Ge layer such that the Ge component ratio x may change from 1 to 0, a Si layer having a thickness of about 1 $\mu$m is epitaxially grown on the $Si_{1-x}Ge_x$ layer. Then, a Fresnel lens to provide a convex lens for focusing infrared on each infrared sensor are formed on the surface of the Si layer.

Then, in a state where the Fresnel-lens-formed side of the cap wafer 150 is pointed downward, as shown in FIG. 7A, an Al film 151 having a thickness of about 600 nm is formed on the surface opposing to the Ge and Si layers of the cap wafer 150 by an evaporation method and sputtering method.

Next, in the process step shown in FIG. 7B, a resist pattern (not shown) is formed on the Al film 151, and the Al film 151 is etched using the resist pattern as a mask, forming a ring-shaped film 144.

Then, in the process step shown in FIG. 7C, using the ring-shaped film 144 as a mask (hard mask), or with the resist pattern left, dry-etching (RIE) is performed to form a drum portion 142 enclosing a recess portion, which provides a cavity for each infrared sensor, on the cap wafer 150. At this time, the cap wafer 150 is configured by a substrate portion 141, having the remaining of the silicon wafer, the Ge layer, Si layer, Fresnel lens, etc., and a drum portion 142. Herein, the height of the drum portion 142 or the depth of the recess portion is more than several $\mu$m.

Further, as a method for forming the cap body, a SOI substrate having an insulating oxide layer (for example, a so-called BOX layer) may be used instead of a bulk Si substrate. In this case, since the Si substrate can be etched under the condition of a high selection ratio of etching between the insulating layer and the Si substrate, the forming of a recess portion can be reliably stopped at the insulating layer.

Next, in the process step shown in FIG. 7D, in the state where the substrate portion 141 of the cap wafer 150 is pointed upward, a depth of cut 152 is formed into the substrate portion 141 of the cap wafer 150 by dry etching using ICP-RIE. The depth of cut is used for separating the substrate potion 141 to form an individual cap body for each infrared sensor. Next, a main body substrate 100 having a structure such as shown in FIG. 5F and FIG. 3A is prepared, and a ring-shaped film 118 of Al having a shape such as shown in FIG. 5F and FIG. 3A is formed on the main body substrate 100.

Next, in the process step shown in FIG. 7E, the cap wafer 150 is placed on the main body wafer 100 on which an infrared sensor has been formed, for example, through process steps shown in FIGS. 5A to 5E, and thus the ring-shaped films 118 and 144 are joined to each other. Thus, a joining step by pressure bonding is performed for forming the ring-shaped joining portions 15 such as shown in FIG. 5F.

Next, in the process step shown in FIG. 7F, the cap wafer is broken along the depth-of-cut portion 152 in the cap wafer 150 into the sections of each infrared sensor, and at the same time, the main body wafer 100 is cut away into the sections of each infrared sensor by dicing, thereby providing a discrete type of infrared sensor (see FIG. 5F) configured by the Si substrate 110 and the cap body 140.

—Detailed Joining Process by Pressure Bonding—

Figure 8:
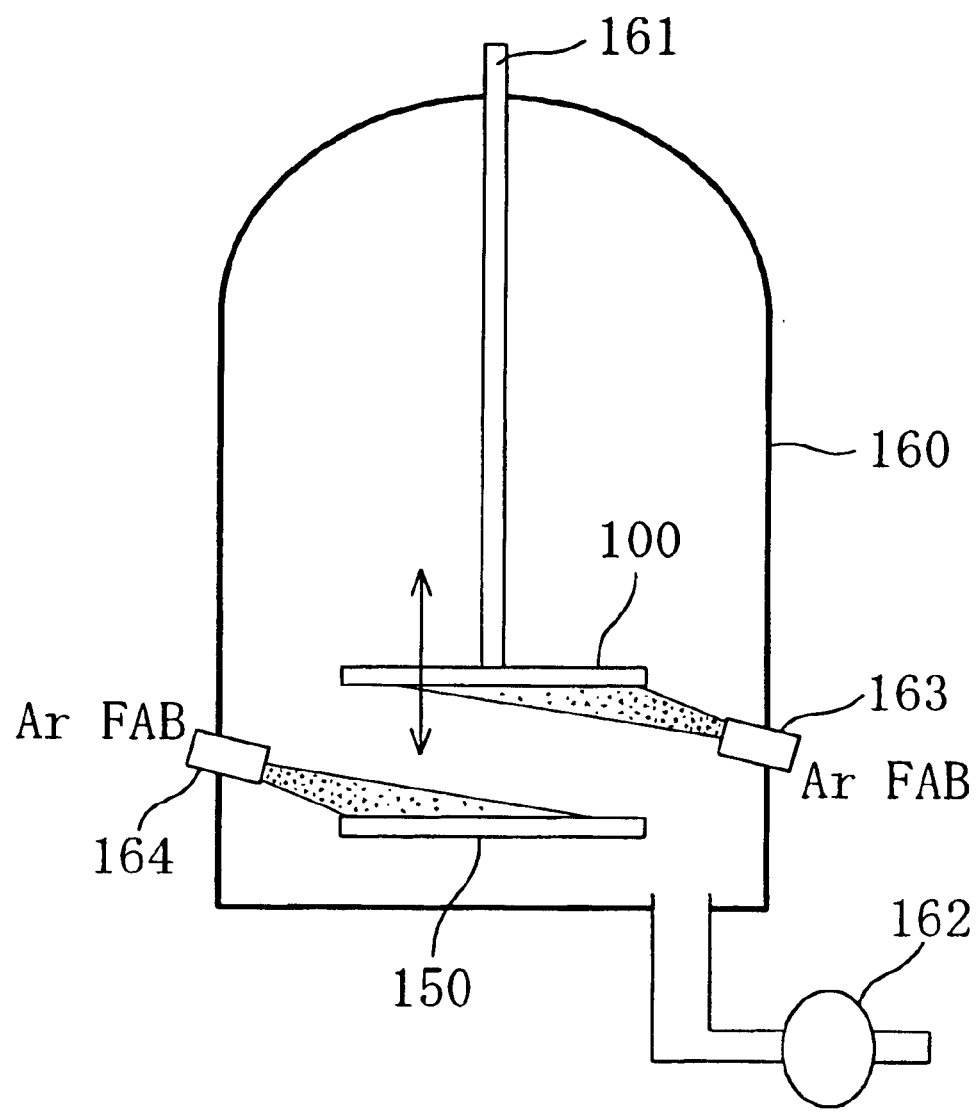
FIG. 8 is a cross-sectional view for schematically showing a configuration of an apparatus used for pressure bonding.

FIG. 8 is a cross-sectional view for schematically showing the configuration of an apparatus used for pressure bonding. As shown in the same figure, a chamber 160 is provided with a supporting member 161 for applying a pressure for use in pressure bonding, a wide band rotary pump 162 for holding vacuum on the inside of the chamber 160, and irradiation equipment 163 and 164 for irradiation with Ar. Thus, in a state where the main body wafer 100 is placed above and the cap wafer 150 is placed below, the irradiation equipment 163, 164 irradiates each ring-shaped films 118 and 144 (see FIG. 7D) with Ar atom beams, respectively. By this processing, contaminants and oxide films are removed from the surface of the Al films constituting the ring-shaped films 118 and 144. After that, while the degree of vacuum in the chamber 160 is being held in a level of $10^{-4}$ Pa, a push pressure of 0.5 MPa–20 MPa is applied between the ring-shaped films 118 and 114 at room temperature (for example, about 30° C.). Thereby, the ring-shaped films 118 and 144 are joined to each other.

At this time, by heating the ring-shaped films 118 and 144 at about 150° C. before pressure bonding, Ar atoms absorbed on the surface may be driven out.

Also, instead of the irradiation with Ar atoms, the irradiation with O atoms and other neutral atoms may be used to expose dangling bonds on the surface of the metal, thereby providing the same advantages as in the embodiment.

As metals used for the joining, other metals (including alloys) than Al can be used. Particularly, by using In, Cu, Au, Ag, and Al—Cu alloy having low melting points, the joining can be performed at room temperature or at low temperature near room temperature. A set of the same metals or a set of different metals among these metals may be used for the joining.

For example, when a In film is formed by evaporation as the ring-shaped film, the surface of the In film is crushed by applying a pressure thereto, and thus natural oxide films existing on the surface are also crushed. Thus, metallic bonds can be established between the In layers. Such pressure bonding may be used, as well.

Also, the joining method is not limited to thermal pressure bonding, and there are the use of ultrasonic joining and a method for establishing the joining by providing plastic deformation at room temperature. Either of them may be used. Further, The use of Si—Si, Si-oxide film, and oxide film-oxide film hydrogen bonding may be also possible.

Particularly, when the joining is made at a degree of vacuum in the range of $10^{-2}$ Pa–$10^{-4}$ Pa, the function of a infrared sensor or the like can be maintained relatively high due to a high degree of vacuum in the internal space, and at the same time, it is possible to avoid difficulty of holding a high vacuum, thus permitting the joining which is practical and suitable for mass production.

According to the embodiment, a whole cell array including many elements such as sensors, emitting elements or the like is not hold under vacuum, in contrast to the conventional devices described above. Using a wafer having a large number of infrared sensors formed therein, it is possible to individually seal each infrared sensor in a vacuum. Therefore, the embodiment is easily applicable for a discrete type of element.

Particularly, the embodiment can use a process for manufacturing electronic devices, particularly, CMOS process as it is, and thus it provides a practical manufacturing method.

Also, the embodiment does not form the sealing portion by the solder joining as in conventional technologies, but forms the sealing portion by using the joining between soft metals such as aluminum. Therefore, it is easily applicable to miniaturization of elements such as an infrared sensor.

Also, the process steps of manufacturing according to the invention can join individually a cap body to each infrared sensor, even in the case of forming a large number of infrared sensors of a discrete type on a wafer. Particularly, as shown in FIG. 7D, by forming the depth-of-cut portion 152 into the substrate portion 141, stress applied to the joining portion can be made uniform for each cell, and thus large local stress does not work during joining, thereby the reliability of the joining portion being improved.

Embodiment 2

Figure 9:
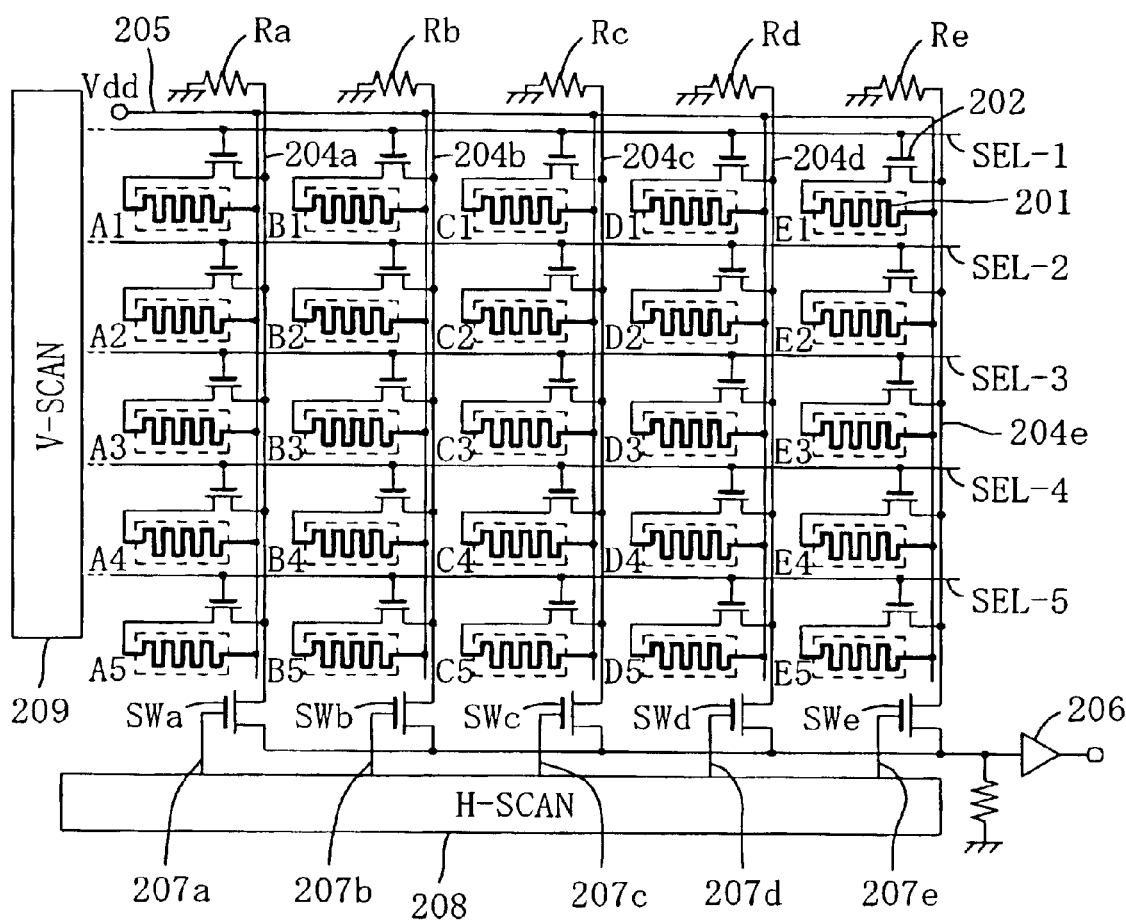
FIG. 9 is an electrical circuit diagram for illustrating a configuration of an infrared area sensor according to Embodiment 2 of the invention.

FIG. 9 is an electrical circuit for illustrating the configuration of an infrared area sensor according to Embodiment 2 of the invention. The concrete structure of the infrared area sensor according to the present embodiment is shown in FIG. 13.

As shown in the same drawing, a main body substrate is provided with a cell array in which a large number of cells A1–E5 each having a bolometer 201 and a switching transistor 202 are disposed in matrix-like arrangement. Although the size of one cell is, for example, about 40 $\mu$m–50 $\mu$m, the size is adequate to be larger than 20 $\mu$m corresponding to about two times the wavelength of infrared radiation to be detected. The gate electrodes of the switching transistors 202 in each cell are connected to selection lines SEL-1–SEL-5 extending from a vertical scanning circuit 209 (V-SCAN).

One end of the bolometer 201 in each cell is connected to a power supply line 205, the sources of the switching transistors 202 are connected to data lines 204a–204e extending from ground through reference resistors Ra–Re. Also, the data lines 204a–204e are connected to an output amplifier 206 through switching transistors SWa–SWe, respectively. Signal lines 207a–207e extending from a horizontal scanning circuit 208 (H-SCAN) are connected to the gate electrode of each switching transistor SWa–SWe.

Figure 10:
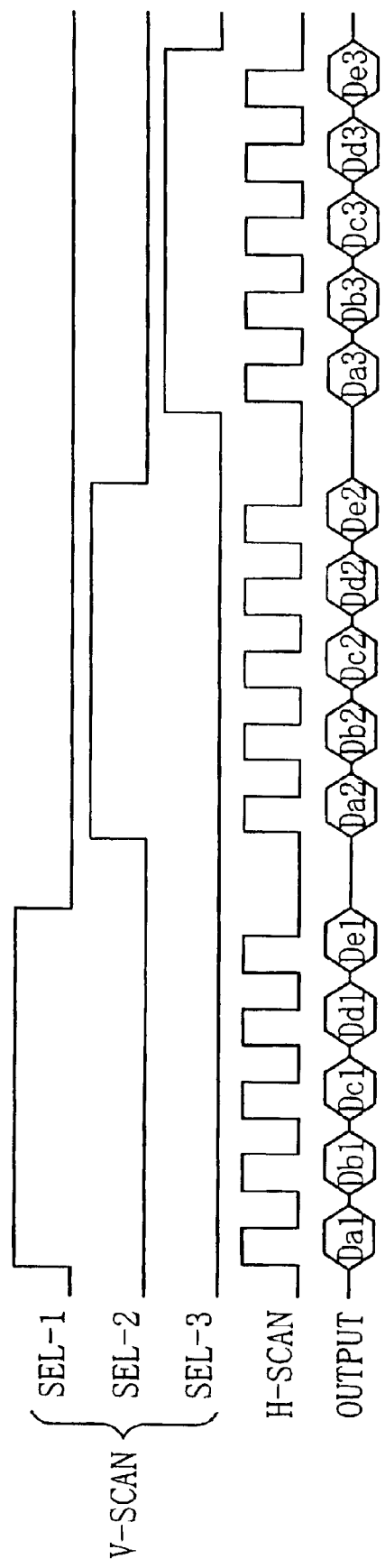
FIG. 10 is a timing chart for showing a method for controlling the infrared area sensor of Embodiment 2.

FIG. 10 is a timing chart for showing a method for controlling the infrared area sensor according to the embodiment. When the selection line SEL-1 is driven by the control from the vertical scanning circuit (V-SCAN), the switching transistors 202 in each of the cells A1–E1 turn on, and the bolometers 201 are supplied with voltages through the reference resistors Ra–Re. On the other hand, the switching transistors SWa–SWe are sequentially driven from the horizontal scanning circuit (H-SCAN), and thus data Da1–De1 from each of the cells A1–E1 are output from the output amplifier 206. Next, when the selection line SEL-2 is driven according to the control from the vertical scanning circuit (V-SCAN), the switching transistors SWa–SWe are sequentially driven according to the control from the horizontal scanning circuit (H-SCAN) and thus data Da2–De2 of each of the cells A2–E2 are output from the output amplifier 206. Similarly, according to the control of the vertical scanning circuit (V-SCAN) and the horizontal scanning circuit (H-SCAN), data Da3–De3 of each of the cells A3–E3, data Da4–De4 of each of the cells A4–E4, and data Da5–De5 of each of the cells A5–E5 are sequentially output from the output amplifier 206.

Thus, input levels of infrared radiation in the cells in which each bolometer 201 are disposed are collected, thereby providing two dimensional information with respect to a detection target.

FIGS. 11A to 11F are perspective views for showing process steps for manufacturing an infrared area sensor having the cell array according to the embodiment.

The process steps shown in FIGS. 11A to 11E perform the same processing as the process steps shown in FIGS. 7A to 7E in Embodiment 1 described above.

Thus, in the process step shown in FIG. 11F, by breaking a cap wafer 150 along a depth-of-cut portion 152, an infrared area sensor having a cap body 140 placed on each cell of the cell array is provided.

Herein, the remaining thickness at the depth-of-cut portion 152 may be adjusted such that the breaking shown in FIG. 11F can occur on application of pressure bonding force for joining. Also, the breaking may be done by separately applying push pressure to the depth-of-cut portion 152 after the completion of the joining by pressure bonding.

By the way, since the infrared area sensor shown in FIGS. 11A to 11F is basically similar to that shown in FIGS. 7A to 7F, the same symbols are used in them. However, generally, the cells in a discrete type of device and the cells in an integration type of device are substantially different in size.

In conventional technologies, it has been impossible to realize an electronic device having a vacuum dome with dimensions of a diameter (or a side) less than several hundreds $\mu$m and a height less than several hundreds $\mu$m. In contrast, the present embodiment allows forming such device. In this case, the wall of the drum portion of the cap body has a thickness less than several tens $\mu$m and the ceiling thereof has a thickness less than several hundreds $\mu$m. Particularly, a vacuum dope having the dimension of a diameter (or a side) less than several tens $\mu$m and a depth less than several $\mu$m may be called "$\mu$ vacuum dome". Also, a technology for forming this vacuum dome requires joining ring-shaped films having a thickness of sub-micron to each other, and therefore it may be called "nano-joining vacuum dome".

Also, in the case of the infrared sensor having a cell array, the main body wafer 100 is provided with a bolometer, wiring for making each cell to cell connection, an electronic circuit, or the like, but the representation of them are omitted in FIGS. 11A to 11F. Further, generally, since the infrared area sensors having a cell array are formed more than one in number on a wafer, after the process step shown in FIG. 11F, the main body wafer 100 is broken into each chip by dicing or the like.

The embodiment can provide the following advantages.

Figure 11:
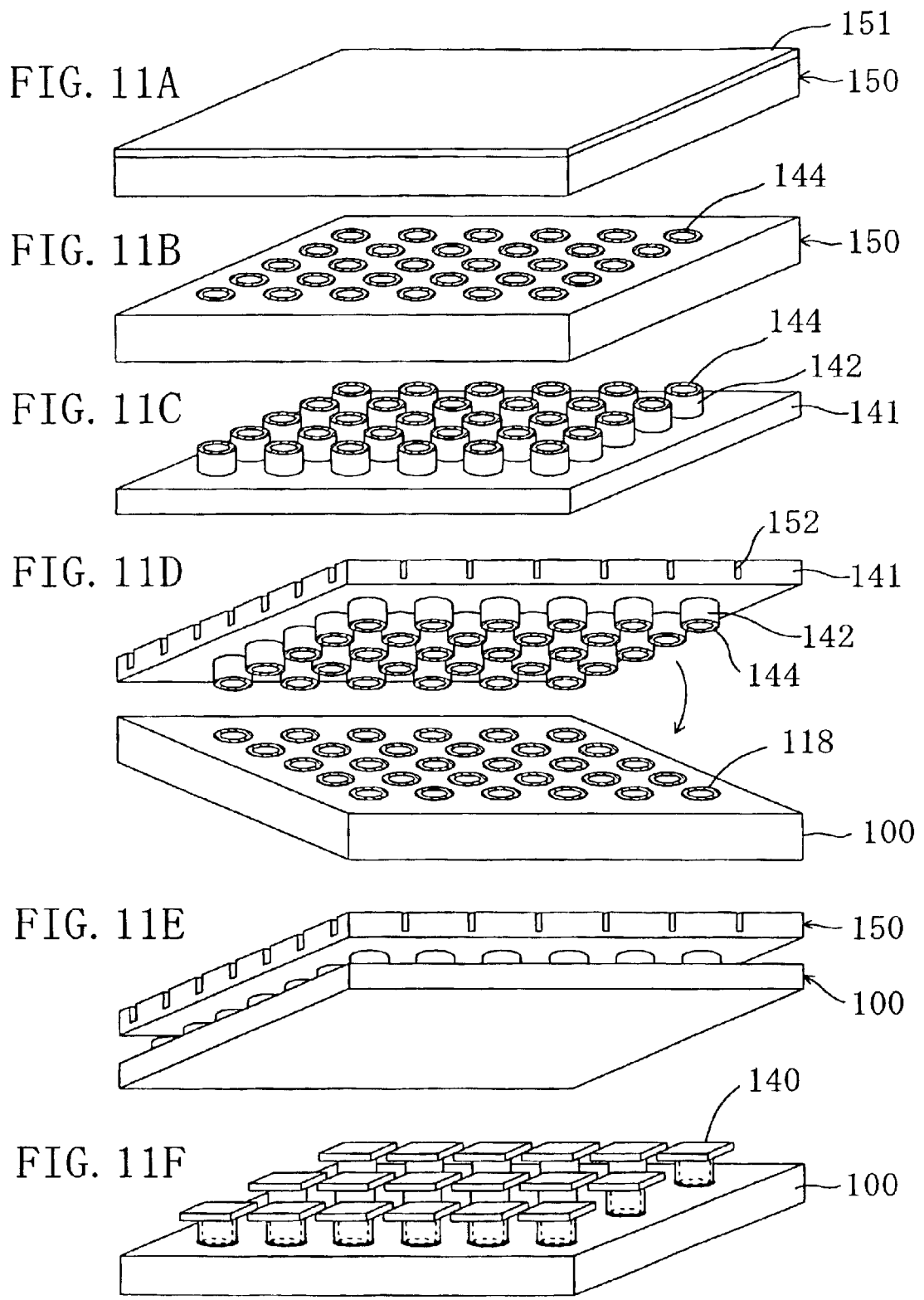
FIGS. 11A to 11F are perspective views for showing a process for manufacturing an infrared area sensor having a cell array according to Embodiment 2.

First, in the case where the region of a large area containing the whole of a cell array is sealed by one cap as in conventional technologies, a large force of pressure bonding is sometimes locally applied to a joining portion during pressure bonding for joining, and thus the joining portion can be destroyed and the substrate can be broken. In contrast, if each cell is individually joined to a cap body as in the embodiment, the stress applied to each joining portion during joining by pressure bonding can be made uniform by the depth-of-cut portion 152 provided in the cap wafer 150 as shown in FIG. 11. At this time, the cap wafer may be configured to be naturally broken along the depth-of-cut portion by the force of pressure bonding for joining. That is, it is possible to prevent the occurrence of an excessively large local stress, thereby permitting an improvement in reliability during joining, during process steps thereafter, or during practical use.

Second, in the case where a whole cell array is sealed in a cap body as in conventional infrared sensors, if a junction failure occurs at part of the joining portion, the whole of the cell array becomes defective and it is almost impossible to provide saving thereto. In contrast, according to the present embodiment, in an electronic device in which a large number of cells each having an element such as an infrared sensor disposed therein are arranged in an array like arrangement, each cell is configured to have a cap body for vacuum sealing. Therefore, even if part of the cells cannot be held under a normal vacuum due to a junction failure in the joining portions thereof, the saving for the defectives can be performed by taking measures for using information of the normal cells adjacent to the defective cells.

Third, in the case where the region of a large area containing the whole of a cell array is sealed by one cap body as in conventional technologies, when the area of the cell array are particularly large, and when the window portion of the cap body is thin, a deflection can be developed in the window portion due to a pressure difference between the atmosphere of reduced pressure within the cap and the external air. Therefore, there are fears that the window portion can be destroyed and that the window portion can come into contact with the cell. In contrast, in the present embodiment, since each cell is provided with a cap body having a small area, such problems can not arise. As a result of this, the window portion can be made thin in thickness to increase the detection sensitivity for infrared radiation, and further the device can be made smaller.

Embodiment 3

Figure 12:
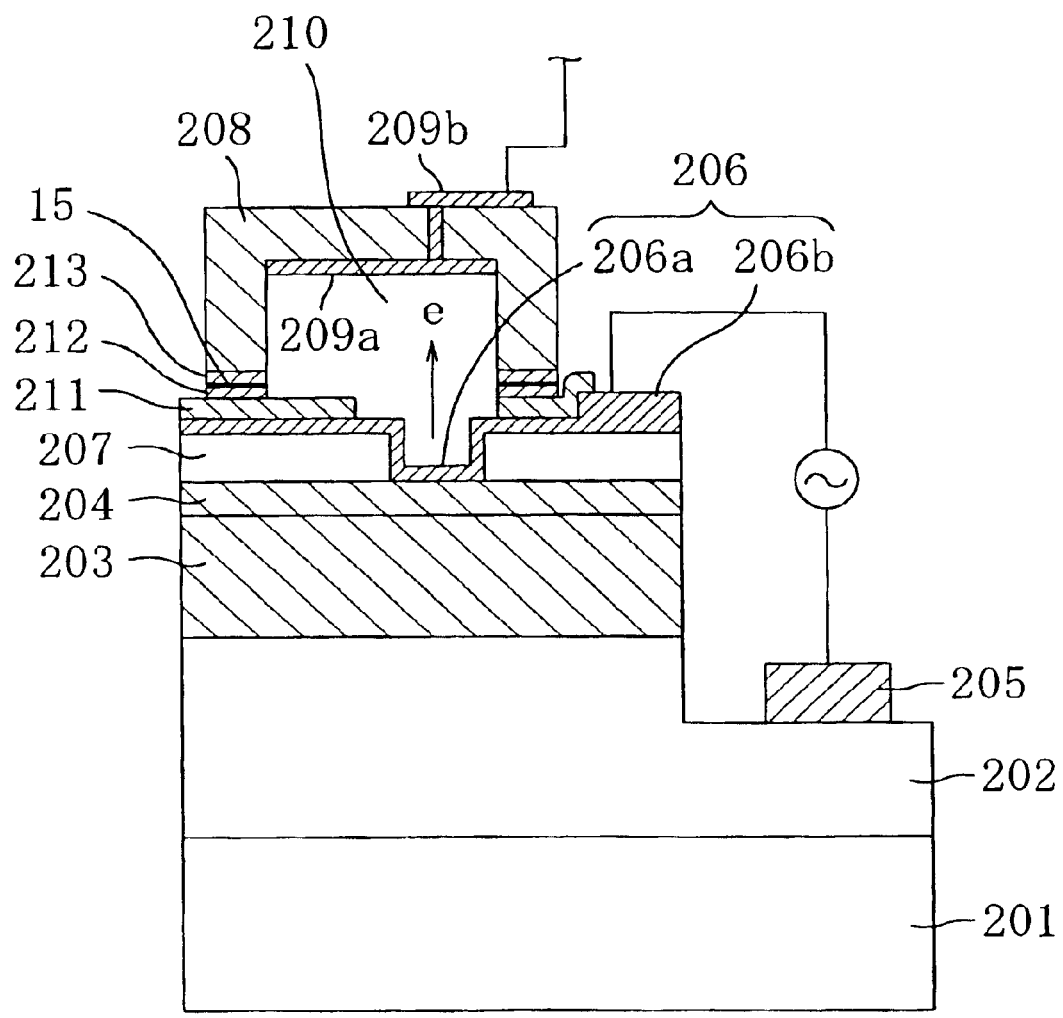
FIG. 12 is a cross-sectional view for showing an example of a micro vacuum transistor having a vacuum dome structure according to Embodiment 3 of the present invention.

FIG. 12 is a cross-sectional view for showing an example of a micro vacuum transistor having a vacuum dome structure according to Embodiment 3 of the invention. The micro vacuum transistor according to the present embodiment comprises a sapphire substrate 201, an n-GaN layer 202 provided on the sapphire substrate 201 and functioning as an electron supplying layer, an $Al_xGa_{1-x}N$ layer 203 provided on n-GaN layer 202 and configured as a composition gradient layer having composition approximately continuously changed and functioning as a electron drift layer, an ALN layer 204 provided on the $Al_xGa_{1-x}N$ layer 203 and functioning as a surface layer, a lower electrode 205 provided on the n-GaN layer 202, a surface electrode 206 provided on the ALN layer 204 and forming a Schottky contact with the ALN layer 204, and a first insulating film 207 provided on the ALN layer 204 and having an opening portion. Further, a thin film portion 206a of the surface electrode 206 is formed on the region extending from the surface of the ALN layer 204 exposed at the bottom plane of the opening portion of the first insulating film 207 to the upper surface of the first insulating film 207 via on the side surface of the opening portion of the first insulating film 207. The thin film portion 206a of the surface electrode 206 is made of thin metal (such as Cu) having a thickness of about 5–10 nm, and the portion of the thin film portion 206a forming Schottky contact with the ALN layer 204 in the opening portion configures an electron emitting portion. Further, a thick film portion 206b of the surface electrode 206 is made of metal having a thickness of not less than 100 nm, and provided on the first insulating film 207, and connected to the thin film portion 206a to function as a contact pad portion of wiring.

Then, a cap body 208 having a drum portion enclosing a vacuum dome 210 is provided on the first insulating film 207, and an upper electrode 209a for collecting electron is provided on the inner surface of the ceiling portion of the cap body 208. Further, an external electrode 209b is provided on the outer surface of the ceiling portion of the cap body 208, and the upper electrode 209a and the external electrode 209b are connected to each other through a through-hole passing through the ceiling portion of the cap body 210. Also, a passivation film 211 of silicon nitride covering the surface electrode 206, a ring-shaped film 212 of Al formed on the passivation film 211, and a ring-shaped film 213 formed on the end portion of the drum portion of the cap body 208 are provided. Thus, the ring-shaped films 212 and 213 are joined to each other by pressure bonding to form the ring-shaped joining portion 15. Further, the vacuum dome 210 has an inner diameter of about 10 $\mu$m and the pressure therein is a reduced pressure of the order of $10^{-4}$ Pa.

In addition, the $Al_xGa_{1-x}N$ layer 203 has a content ratio of Al to Ga is approximately 0 (x=0) in the lower end portion thereof and, conversely, has an Al content ratio of about 1 in the upper end portion.

In this vacuum transistor, electrons emitted according to signals applied between the surface electrode 206 and the lower electrode 205 are accelerated in an electron travel chamber 210 and received by the upper electrode 209. Because the electron travel region is held under vacuum, the vacuum transistor can function as amplifying element or a switching element having high insulating properties, low internal loss, and low temperature dependence.

Embodyment 4

In each embodiment described above, the structures described have a cap body provided individually for each cell region, but the invention is not limited to such embodiments.

Figure 14:
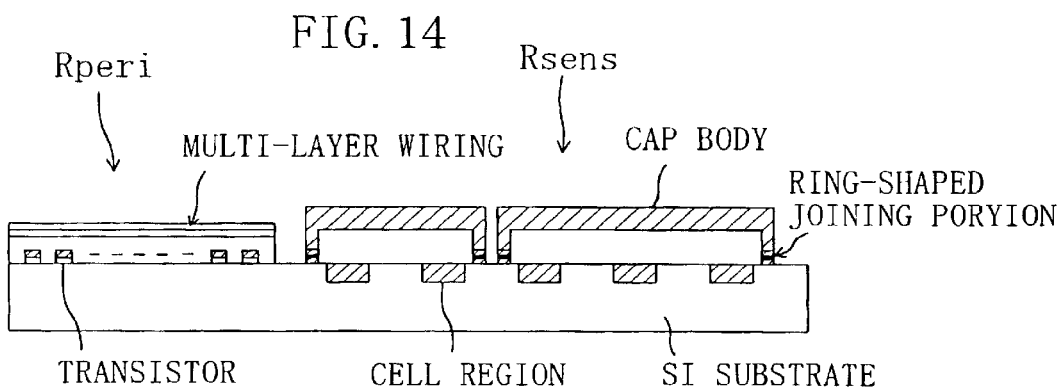
FIG. 14 is a cross-sectional view for showing the whole structure of the infrared sensor according to Embodiment 4 of the present invention.

FIG. 14 is a cross-sectional view for showing the whole structure of an infrared sensor according to a fourth embodiment of the invention. As shown in the same figure, according to the present embodiment, the cap body does not cover each cell in the unit of a cell region, but covers a plurality of cell regions in the sensor regions Rsens. Thus, the ring-shaped joining portion encloses the plurality of sensor regions. The materials of the cap body, and the materials and methods for configuring the ring-shaped joining portion are the same as in Embodiment 1.

Figure 15:
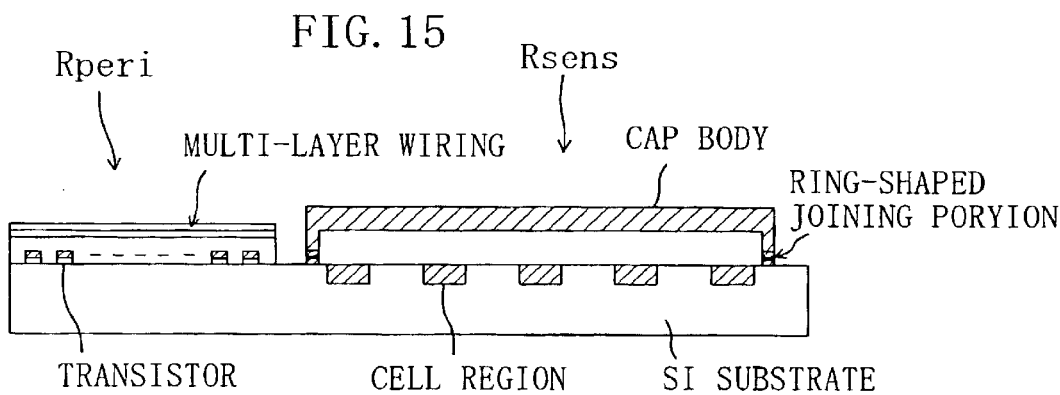
FIG. 15 is a cross-sectional view for showing the whole structure of the infrared sensor according to an example variation of the fourth embodiment 4 of the present invention.

FIG. 15 is a cross-sectional view for showing an infrared sensor according to an example variation of the fourth embodiment 4 of the invention. As shown in the same figure, according to the present embodiment, the cap body does not cover each cell individually, but covers all cell regions in the sensor region Rsens. Thus, the ring-shaped joining portion encloses the whole sensor region Rsens. The materials of the cap body, and the materials and methods for configuring the ring-shaped joining portion are the same as in Embodiment 1.

According to the present embodiment or the example variation, the ring-shaped joining portion is formed by the joining using metallic bonds or hydrogen bonding or the room temperature joining, in contrast to conventional methods using solder. Thus, it is possible to maintain a high degree of vacuum in the space in which resistance elements are sealed, thereby permitting a more improvement in the detection sensitivity and an improvement in detection accuracy of various sensors sealed in the cap body.

Other Embodiments

In each embodiment described above, the description has been performed for the case where the element held in an atmosphere of reduced pressure are a bolometer and vacuum transistor, but the invention is not limited to these embodiments. It is applicable to the entire elements requiring an atmosphere of reduced pressure or an atmosphere of inert gas, for example, a thermoelectric transducer except for a bolometer such as a PN junction diode or the like, an element for detecting or emitting a teramer wave having a wavelength of 40 µm–50 µm, or the like.

Further, in each embodiment described above, the recess portion for configuring a cavity portion and the closed-loop-like drum portion for enclosing the cavity portion are provided only in the cap body, but the invention is not limited to such embodiments. Both of the cap body and the main body substrate may have the recess portion for configuring a cavity portion and the closed-loop-like drum portion for enclosing the cavity portion. In this case, the cap body may be shaped like a flat plate.

Also, the shape of the drum portion enclosing the cavity portion may be tubular and of a polygonal hollow structure such as a hollow rectangular structure. However, to maintain the cavity portion in an atmosphere of reduced pressure, they need to have a closed-loop circular structure.

Further, it is possible to use a structure having only a recess portion provided in the flat main body substrate and not having a drum portion. In this case, the cap substrate may be shaped like a flat plate or may have a recess portion.

Further, it is possible to use a structure having only a recess portion provided in a flat cap-substrate and not having a drum portion. In this case, the main body substrate may be shaped like a flat plate or may have a recess portion.

Also, in each embodiment described above, the cavity portion sealed by the cap body is assumed to be a vacuum dome. In this case, in views of joining the ring-shaped film by pressure bonding performed during the manufacturing process step, preferably the the cavity portion is approximately under a pressure of $10^{-2}$ Pa–$10^{-4}$ Pa, but it is possible to perform the joining at a pressure not greater than $10^{-4}$ Pa and reaching to $10^{-7}$ Pa.

Also, the invention is applicable to a plasma light-emitting element. The invention can be applied to a plasma light-emitting element having a particular atmosphere containing a given gas (for example, helium gas, argon gas, neon gas, xenon gas, krypton gas, hydrogen gas, oxygen gas, nitrogen gas, etc.) and having an atmosphere of a reduced pressure not greater than 133 Pa, as long as the joining can be performed by pressure bonding.

Also, in the plasma light-emitting element described, the cap body of the invention may be configured a material other than semiconductor. For example, by configuring the cap body with a transparent material such as an oxide film and a silicon nitride film, it is possible to provide a device in which a light-emitting element emitting visible light is sealed in an atmosphere of reduced pressure. At the time of using this structure, after deposition of a transparent insulating film or the like on a Si substrate, a drum portion enclosing a recess portion not reaching to the Si substrate (here, the outside surface of the drum portion may reach to the Si substrate) is formed on the transparent insulating film. Then, it is possible to place a transparent cap body on each cell in a procedure in which a cap body is sealed for each cell on the main body substrate according to the joining method described in each above embodiment, and then only the Si substrate is removed by dry etching or the like.

What is claimed is:

1. A method for manufacturing an electronic device comprising:

a step (a) of preparing a main body substrate having a plurality of cell regions in which at least one element is disposed and a cap substrate, and forming a plurality of recess portions each enclosing at least one cell region of said plurality of cell regions on at least any one of said main body substrate and said cap substrate; and a step (b) of permanently forming a closed-loop circular joining portion such that at least part of recess portions of said plurality of recess portions may remain as cavity portions isolated from external space between said main body substrate and said cap substrate, by applying a push pressure between said main body substrate and said cap substrate, by applying a push pressure between said main body substrate and said cap substrate;

wherein said step (a) includes preparing a plurality of first and second ring-shaped films enclosing said recess portions on said main body substrate and cap substrate, respectively, and said step (b) includes forming said closed-loop circular joining portion between said first and second ring-shaped films; and wherein said step (a) is performed by using material selected from at least any one of In, Cu, Al, Au, Ag, Ti, W, Co, Al—Cu alloy, and an oxide film as the materials of said first and second ring-shaped films.

2. A method for manufacturing an electronic device, comprising:

a step (a) of preparing a main body substrate having a plurality of cell regions in which at least one element is disposed and a cap substrate, and forming a plurality of recess portions each enclosing at least one cell region of said plurality of cell regions on at least any one of said main body substrate and said cap substrate; and a step (b) of permanently forming a closed-loop circular joining portion such that at least part of recess portions of said plurality of recess portions may remain as cavity portions isolated from external space between said main body substrate and said cap substrate, by applying a push pressure between said main body substrate and said cap substrate, by applying a push pressure between said main body substrate and said cap substrate;

wherein said step (a) includes preparing a plurality of first and second ring-shaped films enclosing said recess portions on said main body substrate and cap substrate, respectively, and said step (b) includes forming said closed-loop circular joining portion between said first and second ring-shaped films;

wherein said step (a) includes forming recess portions enclosed by said each second ring-shaped film and a plurality of drum portions enclosing said recess portions on said cap substrate and wherein said step (a) includes forming an engagement portion for engaging with the drum portion of said cap substrate in said main body substrate.

3. The method for manufacturing an electronic device according to claim 1 or 2, wherein said step (a) includes preparing a plurality of first and second ring-shaped films enclosing said recess portions on said main body substrate and cap substrate, respectively, and said step (b) includes forming said closed-loop circular joining portion between said first and second ring-shaped films.

4. The method for manufacturing an electronic device according to claim 3, wherein said step (b) is performed with the joining using hydrogen bonding and a metallic bond or with room temperature joining.

5. The method for manufacturing an electronic device according to claim 1, wherein as the materials of said first and second ring-shaped films, the same material is used to both films.

6. The method for manufacturing an electronic device according to claim 1, wherein said step (b) is performed without heating said main body substrate and said cap substrate to a temperature of not less than 450° C.

7. The method for manufacturing an electronic device according to claim 1, wherein said step (a) includes forming a slit for partitioning said cap substrate into a plurality of areas in said cap substrate.

8. The method for manufacturing an electronic device according to claim 3, wherein said step (a) includes forming recess portions enclosed by said each second ring-shaped film and a plurality of drum portions enclosing said recess portions on said cap substrate.

9. The method for manufacturing an electronic device according to claim 1, wherein said step (b) is performed in an atmosphere of reduced pressure, or in an atmosphere of inert gas.

10. The method for manufacturing an electronic device according to claim 9, wherein said step (b) is performed in an atmosphere of reduced pressure having a pressure of higher than $10^{-4}$ Pa.

11. The method for manufacturing an electronic device according to claim 1, further including a step of breaking said main body substrate into each cell after said step (b).

12. The method for manufacturing an electronic device according to claim 2, wherein said step (a) includes forming a first ring-shaped film enclosing a plurality of cell regions on said main body substrate and forming a second ring-shaped film having approximately the same pattern as said first ring-shaped film on said cap substrate.

13. A method for manufacturing an electronic device comprising:

a step (a) of preparing a main body substrate having a plurality of cell regions in which at least one element is disposed and a cap substrate, and forming a recess portion enclosing said plurality of cell regions in at least one of said main body substrate and said cap substrate;

a step (b) of permanently forming a closed-loop circular joining portion with the joining using hydrogen bonding or a metallic bond or with room temperature joining by applying a push pressure between said main body substrate and said cap substrate, wherein in said step (b), said closed-loop circular joining portion is formed such that at least a portion of said recess portions may remain as a cavity portion isolated from external space in said plurality of cell regions;

wherein said step (a) includes forming a first ring-shaped film enclosing a plurality of cell regions on said main body substrate and forming a second ring-shaped film having approximately the same pattern as said first ring-shaped film on said cap substrate; and wherein said step (a) is performed by using material selected from at least any one of In, Cu, Al, Au, Ag, Ti, W, Co, Al—Cu alloy, and an oxide film as the materials of said first and second ring-shaped films.

14. A method for manufacturing an electronic device comprising:

a step (a) of preparing a main body substrate having a plurality of cell regions in which at least one element is disposed and a cap substrate, and forming a recess portion enclosing said plurality of cell regions in at least one of said main body substrate and said cap substrate;

a step (b) of permanently forming a closed-loop circular joining portion with the joining using hydrogen bonding or a metallic bond or with room temperature joining by applying a push pressure between said main body substrate and said cap substrate, wherein in said step (b), said closed-loop circular joining portion is formed such that at least a portion of said recess portions may remain as a cavity portion isolated from external space in said plurality of cell regions;

wherein said step (a) includes forming a first ring-shaped film enclosing a plurality of cell regions on said main body substrate and forming a second ring-shaped film having approximately the same pattern as said first ring-shaped film on said cap substrate;

wherein said step (a) is performed by using material selected from at least any one of In, Cu, Al, Au, Ag, Ti, W, Co, Al—Cu alloy, and an oxide film as the materials of said first and second ring-shaped films; and wherein as the materials of said first and second ring-shaped films, the same material is used to both films.

15. The method for manufacturing an electronic device according to claim 14, wherein said step (b) is performed without heating said main body substrate and said cap substrate to a temperature of not less than 450° C.

16. The method for manufacturing an electronic device according to claim 14, wherein said step (a) is performed such that all cell regions disposed on one electronic device may be enclosed by said first and second ring-shaped films.

17. A method for manufacturing an electronic device, comprising:

a step (a) of preparing a main body substrate having a plurality of cell regions in which at least one element is disposed and a cap substrate, forming a plurality of recess portions each enclosing at least one cell region of said plurality of cell regions on at least any one of said main body substrate and said cap substrate, preparing a plurality of first and second ring-shaped films enclosing said recess portions on said main body substrate and cap substrate, respectively, wherein said step (a) is performed by using material selected from at least any one of In, Cu, Al, Au, Ag, Ti, W, Co, Ka—Cu alloy, and an oxide film as the materials in said first and second ring-shaped films; and a step (b) of forming a closed-loop circular joining portion between said first and second ring-shaped films such that at least part of recess portions of said plurality of recessed portions may remain as cavity portions isolated from external space between said main body substrate and said cap substrate, by applying a push pressure between said main body substrate and said cap substrate.

18. A method for manufacturing an electronic device, comprising:

a step (a) of preparing a main body substrate having a plurality of cell regions in which at least one element is disposed and a cap substrate, forming a plurality of recess portions each enclosing at least one cell region of said plurality of cell regions on at least any one of said main body substrate and said cap substrate, preparing a plurality of first and second ring-shaped films enclosing said recess portions on said main body substrate and cap substrate, respectively, forming recess portions enclosed by said each second ring-shaped film and a plurality of drum portions enclosing said recess portions on said cap substrate, and forming an engagement portion for engaging with the drum portion of said cap substrate and said main body substrate; and a step (b) of forming a closed-loop circular joining portion between said first and second ring-shaped films such that at least part of recess portions of said plurality of recess portions may remain as cavity portions isolated from external space between said main body substrate and said cap substrate, by applying a push pressure between said main body substrate and said cap substrate.

19. A method for manufacturing an electronic device, comprising:

a step (a) of preparing a main body substrate having a plurality of cell regions in which at least one element is disposed and a cap substrate, forming a recess portion enclosing said plurality of cell regions in at least one of said main body substrate and said cap substrate, forming a first ring-shaped film enclosing a plurality of cell regions on said main body substrate and forming a second ring-shaped film having approximately the same pattern as said first ring-shaped film on said cap substrate, wherein said step (a) is performed by using material selected from at least any one of In, Cu, Al, Au, Ag, Ti, W, Co, Al—Cu alloy, and an oxide film as the materials of said first and second ring-shaped films; and a step (b) of forming a closed-loop circular joining portion with the joining using hydrogen bonding or a metallic bond or with room temperature joining by applying a push pressure between said main body substrate and said cap substrate, wherein in said step (b), said closed-loop circular joining portion is formed such that at least a portion of said recess portions may remain as a cavity portion isolated from external space in said plurality of cell regions.

20. The method for manufacturing an electronic device according to claim 19, wherein as the materials of said first and second ring-shaped films, the same material is used to both films.

* * * * *